`US008429496B2`

(12) United States Patent
Yamada et al.

(10) Patent No.: US 8,429,496 B2
(45) Date of Patent: Apr. 23, 2013

(54) SEMICONDUCTOR MEMORY DEVICE AND ERROR CORRECTING METHOD

(75) Inventors: Yutaka Yamada, Kanagawa (JP); Tatsunori Kanai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1047 days.

(21) Appl. No.: 12/360,215

(22) Filed: Jan. 27, 2009

(65) Prior Publication Data
US 2009/0319870 A1 Dec. 24, 2009

(30) Foreign Application Priority Data

Jun. 19, 2008 (JP) ................................ 2008-160685

(51) Int. Cl.
*G11C 29/00* (2006.01)

(52) U.S. Cl.
USPC ........................................................... 714/764

(58) Field of Classification Search .................... 714/764
See application file for complete search history.

(56) References Cited

U.S. PATENT DOCUMENTS

| | | | | |
|---|---|---|---|---|
| 5,134,616 | A * | 7/1992 | Barth et al. ................... | 714/711 |
| 7,035,137 | B2 * | 4/2006 | Iwata et al. ................... | 365/158 |
| 7,272,774 | B2 * | 9/2007 | Co et al. ........................ | 714/764 |
| 2006/0117239 | A1 * | 6/2006 | Lin et al. ....................... | 714/758 |
| 2006/0200729 | A1 * | 9/2006 | Ito et al. ........................ | 714/763 |

FOREIGN PATENT DOCUMENTS

| | | |
|---|---|---|
| JP | 59-20196 | 11/1984 |
| JP | 2-154397 | 6/1990 |
| JP | 3-91198 | 4/1991 |
| JP | 4-219700 | 8/1992 |
| JP | 05-17740 | 3/1993 |
| JP | 09-180496 | 7/1997 |
| JP | 2003-085996 | 3/2003 |
| JP | 2005-327437 | 11/2005 |
| JP | 2008-16092 | 1/2008 |

OTHER PUBLICATIONS

Office Action issued Oct. 2, 2012, in Japanese Patent Application No. 2008-160685, filed Jun. 19, 2008 (with English-language Translation).
Japanese Office Action issued Jan. 29, 2013, in Japanese Patent Application No. 2008-160685 filed Jun. 19, 2008 (with English Translation).

\* cited by examiner

*Primary Examiner* — Albert Decady
*Assistant Examiner* — Enam Ahmed
(74) *Attorney, Agent, or Firm* — Oblon, Spivak, McClelland, Maier & Neustadt, L.L.P.

(57) ABSTRACT

A decoding unit is arranged between a reading unit that reads data with an error correction code added from memory cells on a specific one of the first data lines and an output unit that selectively outputs certain data of the read out data. The decoding unit corrects any errors in the data read out by the reading unit in accordance with the error correction code. The data in which the errors are corrected by the decoding unit is written back in the memory cells on the specific first data line.

12 Claims, 13 Drawing Sheets

| LINE ADDRESS | ROW ADDRESS | DATA | OVERWRITE DETERMINATION INFORMATION |
|---|---|---|---|
| 0 | addr0 | data0 | TRUE |
| 1 | addr1 | data1 | FALSE |
| ⋮ | ⋮ | ⋮ | ⋮ |
| N | N/A | N/A | TRUE |

FIG.17

| LINE ADDRESS | ROW ADDRESS | DATA | OVERWRITE DETERMINATION INFORMATION | AVAILABILITY DETERMINATION INFORMATION |
|---|---|---|---|---|
| 0 | addr0 | data0 | TRUE | TRUE |
| 1 | addr1 | data1 | FALSE | TRUE |
| ⋮ | ⋮ | ⋮ | ⋮ | ⋮ |
| N | N/A | N/A | TRUE | FALSE |

SEMICONDUCTOR MEMORY DEVICE AND ERROR CORRECTING METHOD

CROSS-REFERENCE TO RELATED APPLICATIONS

This application is based upon and claims the benefit of priority from the prior Japanese Patent Application No. 2008-160685, filed on Jun. 19, 2008; the entire contents of which are incorporated herein by reference.

BACKGROUND OF THE INVENTION

1. Field of the Invention

The present invention relates to a semiconductor memory device having an error detecting and correcting function and a method of correcting errors in the semiconductor memory device.

2. Description of the Related Art

An error correcting mechanism has been used in a semiconductor memory device as a means to avoid data losses and thereby improve the reliability of the device. For example, JP-A 2008-16092 (KOKAI) discloses a structure in which an error correcting mechanism is arranged separately from a COL address decoder of a semiconductor memory device to correct errors in data that is output from the COL address decoder to the outside.

Volatile memories such as a DRAM, which lose accumulated electrical charge with time, need to perform refresh at regular time intervals to avoid loss of accumulated data. On the other hand, in nonvolatile memories such as an MRAM, loss of accumulated data does not depend on the passage of time, but the loss occurs when a reading or writing operation is executed onto memory cells of the nonvolatile memory. Thus, error detection and correction has to be performed when an access is made to the memory cells.

In the structure as disclosed in JP-A 2008-16092, however, in which an error correcting mechanism is arranged outside the COL address decoder, error correction is performed onto data output from the COL address decoder only, out of the data read from the memory cell array. In other words, because only part of the data that is read from the memory cells is subjected to the error correction, it is difficult to correct errors in any data other than the data output from the COL address decoder when an error is detected in such data.

SUMMARY OF THE INVENTION

According to one aspect of the present invention, there is provided a semiconductor memory device including a memory cell array in which a plurality of memory cells that stores therein coded data to which an error correction code is added are arranged at intersections of a plurality of first data lines and a plurality of second data lines; an enabling unit that enables one of first data lines that is designated from outside; a reading unit that reads a plurality of coded data from memory cells on an enabled first data line; a decoding unit that corrects an error in the coded data read by the reading unit using the error correction code, and generates decoded data by decoding the coded data; an output unit that outputs, from among the decoded data, decoded data corresponding to a memory cell on a second data line designated from the outside to the outside; a coding unit that codes the decoded data to coded decoded data, and generates coded data by adding the error correction code to coded decoded data; and a write-back unit that writes back the coded data generated by the coding unit onto the memory cells on the enabled first data line.

Furthermore, according to another aspect of the present invention, there is provided an error correcting method for a semiconductor memory device including a memory cell array in which a plurality of memory cells that stores therein coded data to which an error correction code is added are arranged at intersections of a plurality of first data lines and a plurality of second data lines. The error correcting method includes enabling one of first data line that is designated from outside; reading a plurality of coded data from memory cells on an enabled first data line; decoding including correcting an error in the coded data read at the reading using the error correction code, and generating decoded data by decoding the coded data; outputting, from among the decoded data, decoded data corresponding to a memory cell on a second data line designated from the outside to the outside; coding including coding the decoded data to coded decoded data, and generating coded data by adding the error correction code to coded decoded data; and writing back the coded data generated at the coding onto the memory cells on the enabled first data line.

Moreover, according to still anther aspect of the present invention, there is provided a computer-readable recording medium that stores therein a computer program for correcting an error in a semiconductor memory device including a memory cell array in which a plurality of memory cells that stores therein coded data to which an error correction code is added are arranged at intersections of a plurality of first data lines and a plurality of second data lines. The computer program when executed causes a computer to execute enabling one of first data line that is designated from outside; reading a plurality of coded data from memory cells on an enabled first data line; decoding including correcting an error in the coded data read at the reading using the error correction code, and generating decoded data by decoding the coded data; outputting, from among the decoded data, decoded data corresponding to a memory cell on a second data line designated from the outside to the outside; coding including coding the decoded data to coded decoded data, and generating coded data by adding the error correction code to coded decoded data; and writing back the coded data generated at the coding onto the memory cells on the enabled first data line.

BRIEF DESCRIPTION OF THE DRAWINGS

FIG. 17 is a schematic diagram for showing another example of line data stored in the data control circuit.

DETAILED DESCRIPTION OF THE INVENTION

Exemplary embodiments of the present invention are explained in detail below with reference to the accompanying drawings.

A semiconductor memory device 100 according to the first embodiment is explained first. The semiconductor memory device 100 performs data write and read processes onto a semiconductor memory (memory cell array unit 11) contained in the device, in response to various types of externally input signals (such as a control signal CTRL, ROW/COL address signals, and control signals WE and RE that are discussed later). The word "externally" indicates any external device connected to the semiconductor memory device 100.

Figure 1:
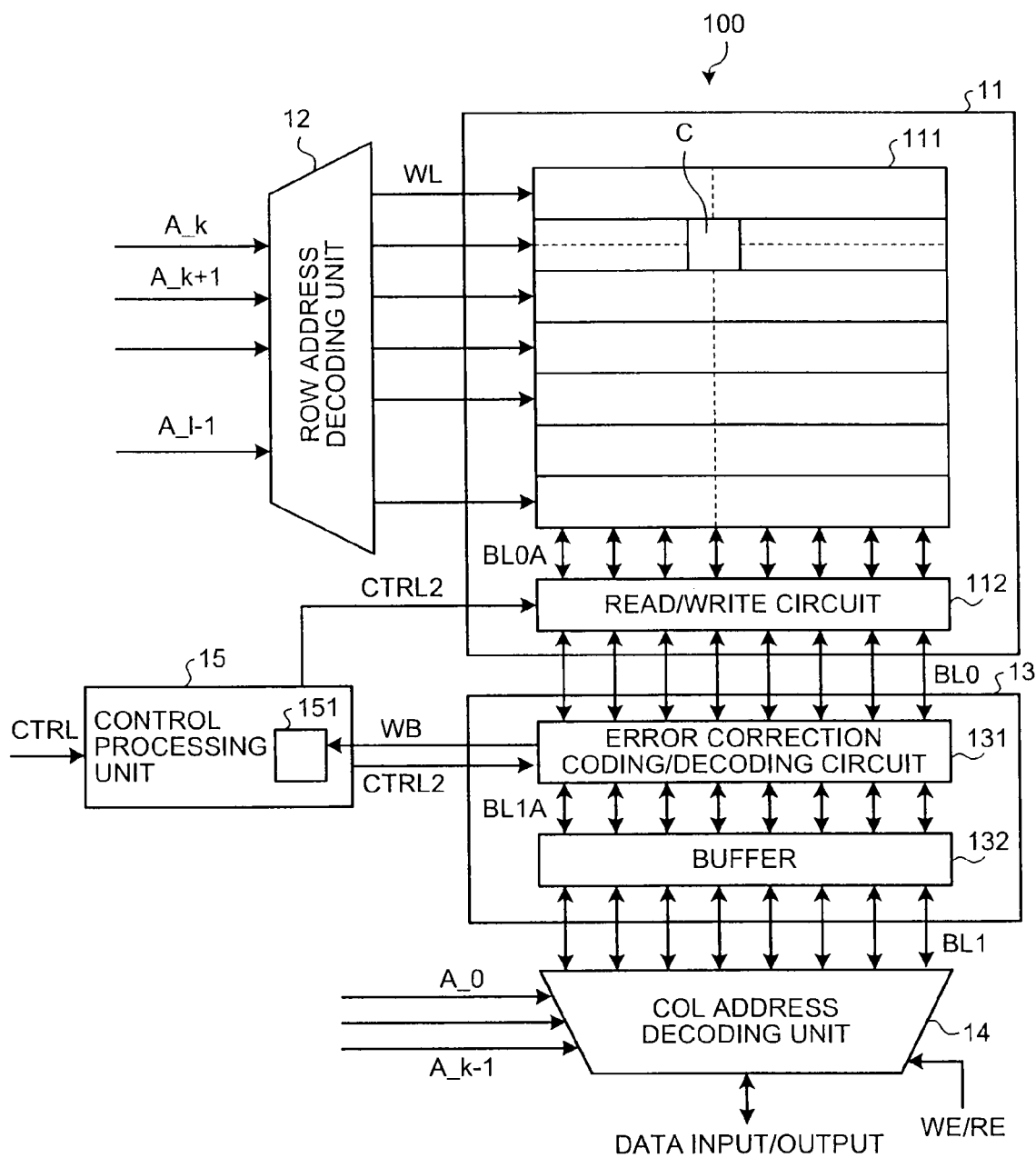
FIG. 1 is a diagram of a structure of a semiconductor memory device according to a first embodiment.

FIG. 1 is a block diagram of the structure of the semiconductor memory device 100 according to the first embodiment. The semiconductor memory device 100 includes the memory cell array unit 11, a ROW address decoding unit 12, an error correction processing unit 13, a COL address decoding unit 14, and a control processing unit 15.

The memory cell array unit 11 includes a memory array 111 having multiple memory cells (a memory cell illustrated as "C" in FIG. 1) arranged in a matrix and a read/write circuit 112.

The memory array 111 is a readable and writable semiconductor memory, in which word lines WL running in the row direction and bit lines BL0A running in the column direction intersect one another. Memory cells are positioned individually at the intersecting points of the word lines WL and the bit lines BL0A, forming a matrix in the row and column directions altogether. Hereinafter, an address of a memory cell in the row direction of the memory array 111 is referred to as a ROW address, and an address in the column direction is referred to as a COL address.

The memory array 111 includes an area for storing an error correction code that is discussed later. During the operations of writing and reading data, the error correction code of the target data is also written in and read out.

The memory cell array unit 11 may be a readable and writable semiconductor memory of any type. For example, a static random access memory (SRAM), a dynamic random access memory (DRAM), a ferroelectric random access memory (FeRAM), a magnetoresistive random access memory (MRAM), a phase change random access memory (PRAM), a resistance random access memory (ReRAM), or a Flash ROM may be adopted for the memory array 111.

In response to a control signal CTRL2 input by the control processing unit 15, the read/write circuit 112 performs operations of reading and writing data from and into memory cells of the memory array 111. As described later, the data stored in the memory array 111 is already subjected to an error correction coding process, with an error correction code added thereto. Hereinafter, the data that has been subjected to the error correction coding process is referred to as "coded data".

More specifically, in the operation of reading coded data from the memory array 111, the read/write circuit 112 reads the coded data by way of the bit lines BL0A from the memory cells on a word line WL that is enabled by the ROW address decoding unit 12. The read/write circuit 112 then outputs the coded data to the error correction processing unit 13 (error correction coding/decoding circuit 131) by way of bit lines BL0 that correspond to the COL addresses of the memory cells.

When writing the data in the memory array 111, the read/write circuit 112 outputs the coded data that is input by way of the bit lines BL0, to the memory array 111 by way of the bit lines BL0A that correspond to the bit lines BL0. The write operation is thereby performed onto the memory cells that are positioned on the word line WL enabled by the ROW address decoding unit 12.

The circuit that performs the data read/write operations onto the memory array 111 is illustrated as a single read/write circuit 112 in FIG. 1. In reality, the read and write operations are implemented by different circuits. More specifically, the data reading circuit is a circuit that converts the coded data on the bit lines BL0A of the memory array 111 into a format suitable for outputting it to the outside. For example, a sense amplifier circuit may be adopted for this circuit.

The data writing circuit is a circuit that converts the coded data that is input by way of the bit lines BL0 from the error correction processing unit 13 (error correction coding/decoding circuit 131) into a format suitable for inputting it to the bit lines BL0A of the memory array 111. For example, a driver circuit may be adopted for this circuit. For the read/write circuit 112 (read circuit and write circuit), circuits suitable for the type of the memory array 111 should be chosen.

The memory array 111 (bit lines BL0A) and the read/write circuit 112 may be connected in any manner. Any of the examples of the connections illustrated in FIGS. 2 to 4 may be adopted. The examples of the connections between the memory array 111 and the read/write circuit 112 are explained below with reference to FIGS. 2 to 4.

Figure 2:
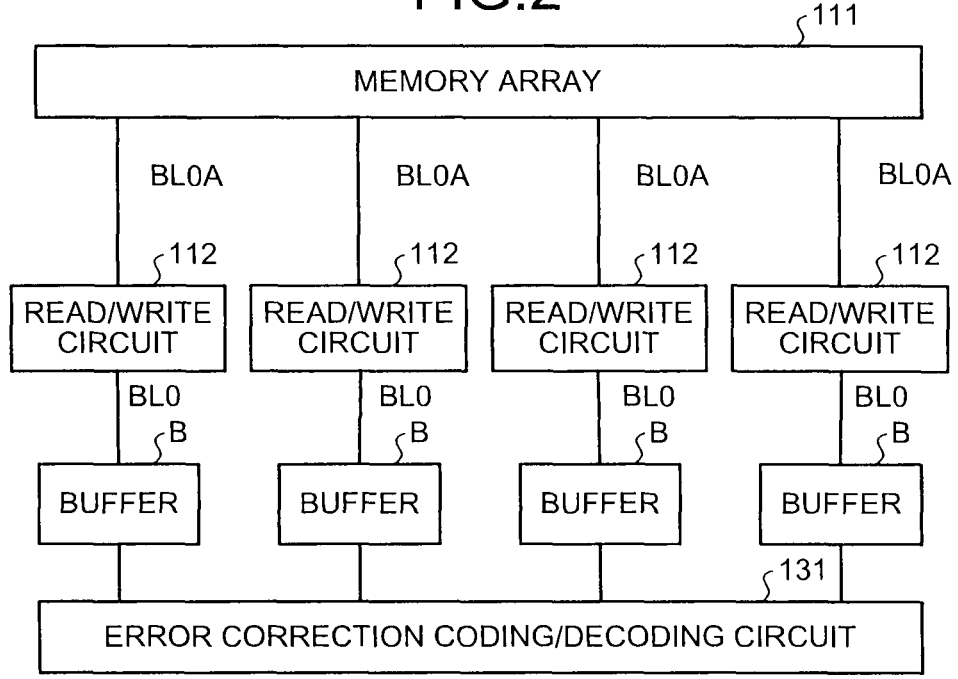
FIG. 2 is a diagram for showing an example connection between a memory array and read/write circuits.

FIG. 2 is a diagram for showing an example connection between the memory array 111 (bit lines BL0A) and the read/write circuit 112. In this example, the read/write circuit 112 is provided for each of the bit lines BL0A.

In the structure of FIG. 2, each of the read/write circuits 112 individually performs a read/write operation on a memory cell of a corresponding one of the bit lines BL0A to which the read/write circuits 112 are connected. With such a structure, the read/write circuits 112 operate independently of one another, and perform the data read/write operation onto multiple memory cells at a time. This increases the processing speed. Buffers B arranged between the read/write circuits 112 and the error correction coding/decoding circuit 131 are storage devices that temporarily store therein data exchanged between the read/write circuits 112 and the error correction coding/decoding circuit 131.

Figure 3:
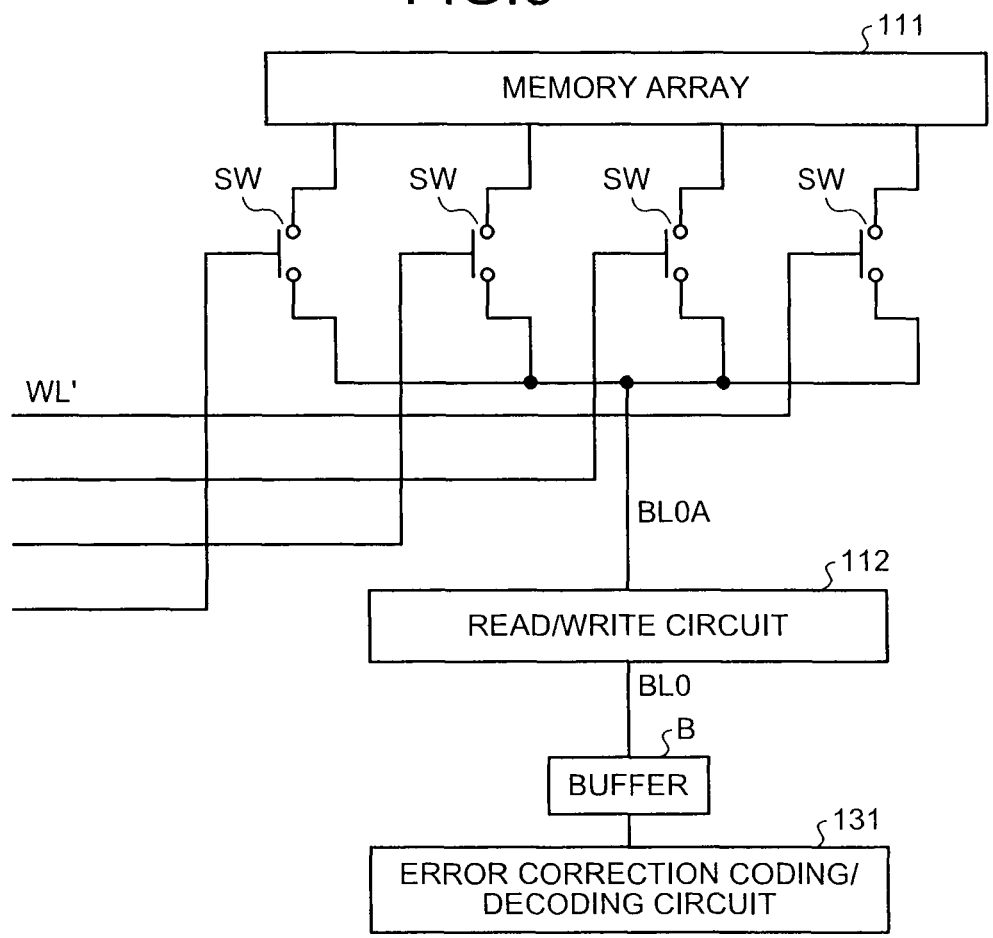
FIG. 3 is a diagram for showing another example connection between a memory array and a read/write circuit.

FIG. 3 is a diagram for showing another example connection between the memory array 111 (bit lines BL0A) and the read/write circuit 112. A switch SW is provided for each of the bit lines BL0A, and different dummy word lines WL' are connected individually to the switches SW.

The dummy word lines WL' are branch lines of the word lines WL that connect the ROW address decoding unit 12 to the memory array 111. When a word line WL is enabled by the ROW address decoding unit 12, the dummy word line WL' that is a branch of this word line WL is also enabled. When the ROW address decoding unit 12 enables the dummy word lines WL', the switch SW turns the bit line BL0A into a conductive state (ON). When the word line WL is disabled, the switch SW turns the bit lines BL0A into a non-conductive state (OFF).

The bit lines BL0A are connected to a single read/write circuit 112. The read/write circuit 112 conducts operations of reading and writing the coded data onto the memory cells that correspond to the bit lines BL0A that are turned into a conductive state by way of these bit lines BL0A. In this structure, the bit lines BL0A are logically regarded as independent lines by the on/off switching of the switches SW. In addition, because the bit lines BL0A share the single read/write circuit 112 by the on/off switching of the switches SW, the memory array 111 can be dealt with in a device requiring fewer read/write circuits 112.

Figure 4:
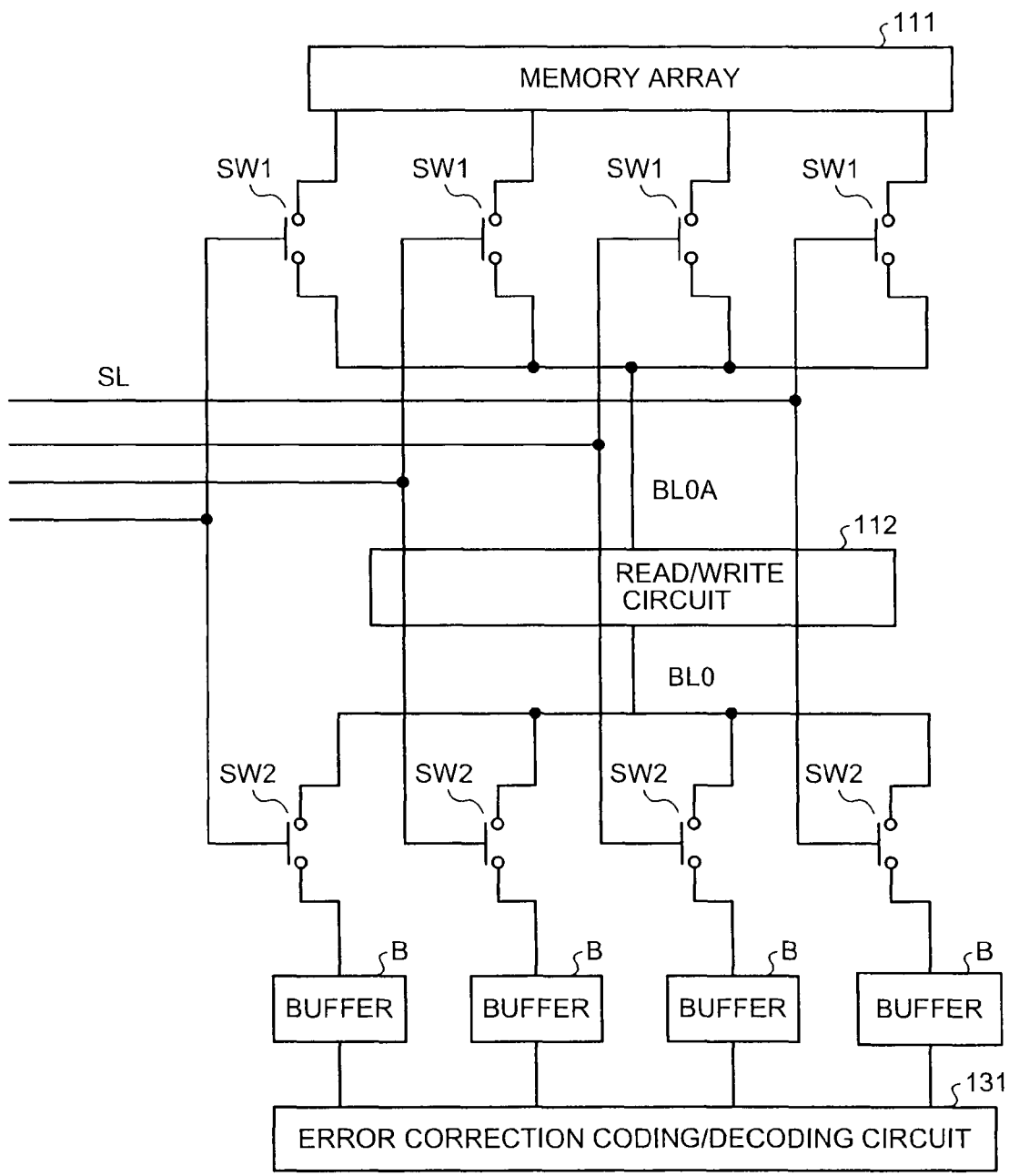
FIG. 4 is a diagram for showing still another example connection between a memory array and a read/write circuit.

FIG. 4 is a diagram for showing another example of the connection between the memory array 111 (bit lines BL0A) and the read/write circuit 112. A switch SW1 is arranged on each of the bit lines BL0A, and a switch SW2 is arranged on each of the bit lines BL0. The bit lines BL0A and the bit lines BL0 are both connected to the single read/write circuit 112. A buffer B is arranged on each of the bit lines BL0 to temporarily store the coded data exchanged between the read/write circuit 112 and the error correction coding/decoding circuit 131.

Each of select lines SL has one end connected to a pair of the switches SW1 and SW2, and the other end connected to the control processing unit 15 and not-shown external devices. In response to a select signal input by way of the select line SL, the switches SW1 and SW2 turn the bit lines BL0A and BL0 into a conductive state (ON). The control processing unit 15 and the not-shown external devices input select signals to the select lines SL at different timings to turn the switches SW1 and SW2 to an ON state so that the bit lines BL0A and BL0 can be switched on/off for the conductive state in a time-division manner in accordance with the corresponding select lines.

The read/write circuit 112 performs the operation of reading and writing the coded data, by use of the conductive bit lines BL0A and BL0, onto the memory cells corresponding to the bit lines BL0A. With such a structure, the operation of reading and writing the coded data is conducted onto the memory array 111 sequentially by use of the bit lines (bit lines BL0A and BL0) that are switched around in a time-division manner. Hence, the number of read/write circuits 112 required for the memory array 111 can be reduced.

In FIG. 1, the ROW address decoding unit 12 interprets an externally supplied ROW address signal (A_[1-1:k]) and enables a word line WL that corresponds to a ROW address designated by the ROW address signal so that a group of memory cells positioned on this word line are selected. The ROW address designated by the ROW address signal is uniquely associated with one of the word lines WL of the memory cell array unit 11.

The error correction processing unit 13 is arranged between the memory cell array unit 11 and the COL address decoding unit 14, and includes the error correction coding/decoding circuit 131 and a buffer 132.

The error correction coding/decoding circuit 131 receives the control signal CTRL2 from the control processing unit 15, and performs an error correction decoding process and an error correction coding process onto the data exchanged with the read/write circuit 112. The error correction coding/decoding circuit 131 thereby detects and corrects errors in the data. For the error correction decoding process and the error correction coding process performed by the error correction coding/decoding circuit 131, conventional technologies related to an error correcting code (ECC) such as Reed-Solomon code may be incorporated.

More specifically, in the operation of reading from the memory cell array unit 11, the error correction coding/decoding circuit 131 conducts an error correction decoding process on the coded data input from the read/write circuit 112 by way of the bit lines BL0. The error correction coding/decoding circuit 131 thereby detects and corrects errors in the data based on the error correction code that is added to the coded data, and generates decoded data by decoding the coded data. Furthermore, the error correction coding/decoding circuit 131 outputs the decoded data that is subjected to the error correction decoding process to the buffers 132 by way of the bit lines BL1A so that a write operation is performed onto the memory areas of the buffers 132 corresponding to the bit lines BL0 (in other words, COL addresses). When an error is detected in the coded data during the error correction decoding process, the error correction coding/decoding circuit 131 outputs a control signal WB to the control processing unit 15 to enable a write-back flag 151, which will be discussed later. The write-back flag 151 is thereby enabled.

Moreover, at the time of writing (write-back) in the memory array 111, the error correction coding/decoding circuit 131 performs the error correction coding process on the write target decoded data stored in the buffer 132 to code this data, and thereby generates coded data to which an error correction code is added for error detection and correction. The error correction coding/decoding circuit 131 outputs the coded data that is subjected to the error correction coding process to the read/write circuit 112 by way of the bit line BL0 that corresponds to an area on the buffer 132 (in other words, COL address) storing therein the decoded data from which this coded data is generated.

The buffer 132 is a storage device that temporarily stores therein the decoded data. The buffer 132 holds the data read from the memory array 111 and the target data to be written in the memory array 111. The areas of the buffers 132 are controlled in association with the COL addresses of the memory array 111, and thus an access to these areas is made by way of the bit lines BL1A and BL1 that correspond to the COL addresses indicated by the areas. The buffer 132 should be given a capacity of storing data at least for one line (COL address) of the memory array 111. The storage capacity may be large enough to store decoded data for multiple lines.

The COL address decoding unit 14 interprets an externally supplied COL address signal (A_[k-1:0]), and makes an access to the buffer 132 by way of a bit line BL1 that corresponds to the COL address designated by the COL address signal. Furthermore, the COL address decoding unit 14 performs the data write and read operations onto an area of the buffer 132 in accordance with an externally supplied control signal (control signals WE and RE that will be discussed later).

The structure may be such that a burst signal is externally supplied to the COL address decoding unit 14 to instruct it to sequentially perform the data read and write operations with respect to consecutive COL addresses. When receiving the burst signal, the COL address decoding unit 14 sequentially performs the data read and write operations onto the consecutive COL addresses designated by the burst signal.

Other examples of signals that may be externally supplied to the COL address decoding unit 14 include a chip enable (CE) signal, an output enable (OE) signal, and a read write (RW) signal. If the RW signal is adopted, "1" of the binary digits of the RW signal can be used for the read operation, while "0" can be used for the write operation (or vice versa) so that they can be substituted for the control signals WE and RE.

The control processing unit 15 receives the control signal CTRL that instructs a data write or read operation from an external device, and sends the control signal CTRL2 to the read/write circuit 112 and the error correction coding/decoding circuit 131 to instruct the start of a write or read process that will be discussed later so that the related units execute the operations in accordance with the process.

The control processing unit 15 holds the write-back flag 151 that indicates whether the write process should be performed onto an internal register or the like. When the error correction coding/decoding circuit 131 finds the write-back flag 151 in the enable state, the error correction coding/decoding circuit 131 sends the control signal CTRL2 out to instruct the start of the write-back process, which will be discussed later, so that the related units execute the operations in accordance with the process.

The write and read processes conducted by the semiconductor memory device 100 are explained below.

Figure 5:
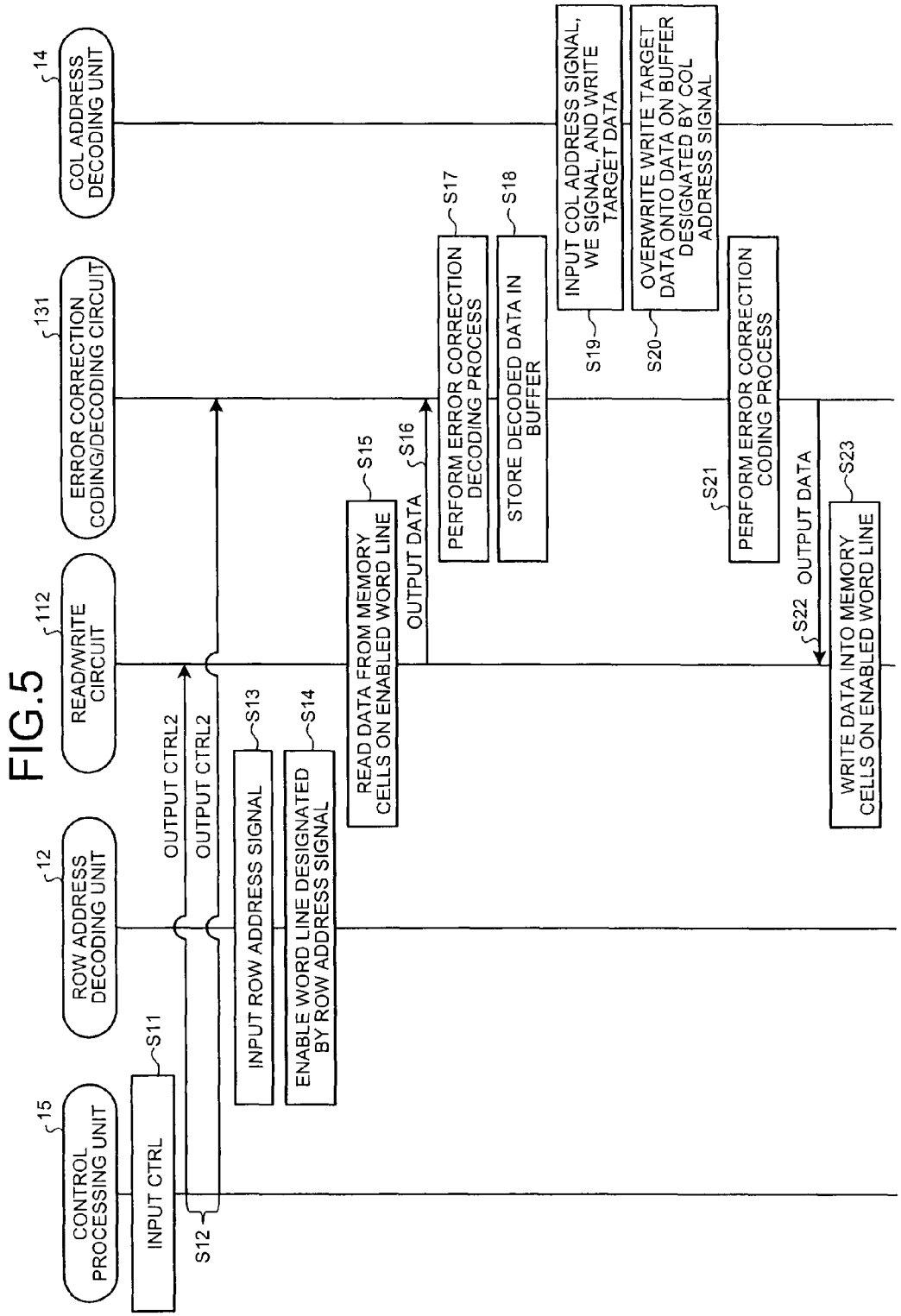
FIG. 5 is a sequence diagram for explaining the procedure of a write process according to the first embodiment.

First, the operations performed when writing the externally supplied data to the memory cell array unit 11 are explained with reference to FIGS. 5 to 7. FIG. 5 is a sequence diagram showing the procedure of the write process executed by the semiconductor memory device 100. First, when a control signal CTRL is externally supplied to issue a data write instruction (Step S11), the control processing unit 15 outputs a control signal CTRL2 that indicates the start of the write process to the read/write circuit 112 and the error correction coding/decoding circuit 131 (Step S12), and thereby the write process is initiated.

Thereafter, the ROW address decoding unit 12 receives the ROW address signal from the outside (Step S13), and enables a word line WL that corresponds a ROW address designated by the ROW address signal (Step S14). Then, the read/write circuit 112 reads coded data from memory cells on the word line WL enabled at Step S14 (Step S15), and outputs the data to the error correction coding/decoding circuit 131 by way of the bit lines BL0 (Step S16).

The error correction coding/decoding circuit 131 implements the error correction decoding process onto the coded data input by the read/write circuit 112 to generate decoded data (Step S17), and outputs the decoded data to the buffer 132 by way of the bit lines BL1A. The decoded data is thereby stored in a predetermined area of the buffer 132 (Step S18).

On the other hand, when the COL address decoding unit 14 receives the COL address signal, the control signal WE as a write instruction, and the write target data from the outside (Step S19), the COL address decoding unit 14 overwrites the write target data onto the area of the buffer 132 that corresponds to the COL address designated by the COL address signal by way of the bit lines BL1 so that the data is updated (Step S20). The operation of writing the target data into the buffer 132 may be conducted all at once or divided into several times if the items of the decoded data have the same ROW address.

When the data overwrite operation is completed at Step S20, the error correction coding/decoding circuit 131 performs an error correction coding process onto the entire decoded data that includes the overwritten data to generate coded data from this decoded data (Step S21). Thereafter, the error correction coding/decoding circuit 131 outputs the coded data generated at Step S21 to the read/write circuit 112 by way of the bit lines BL0 (Step S22).

The read/write circuit 112 receives the coded data from the error correction coding/decoding circuit 131, and writes the coded data in the memory cells on the word line enabled by the ROW address decoding unit 12. The write target data is thereby stored in the memory array 111 (Step S23), and the process is terminated.

In the semiconductor memory device 100, the coded data to which an error correction code is added is written in the memory cell array unit 11 (memory array 111). In the process according to the present embodiment, the COL address, the control signal for the write instruction, and the write target data are input to the COL address decoding unit 14 after the ROW address is input. However, the timing is not limited thereto, and may be at the same timing as the input of the ROW address.

Furthermore, according to the present embodiment, the process is initiated in accordance with the input of the control signal CTRL, but the initiation is not limited thereto. For example, the process may be initiated when a ROW address signal is input to the ROW address decoding unit 12. If this is the case, the control signal CTRL that indicates a write instruction should be input any time before Step S19. When the control signal CTRL includes a predetermined control command, the control signal CTRL2 may be generated by interpreting (decoding) this command.

Figure 6:
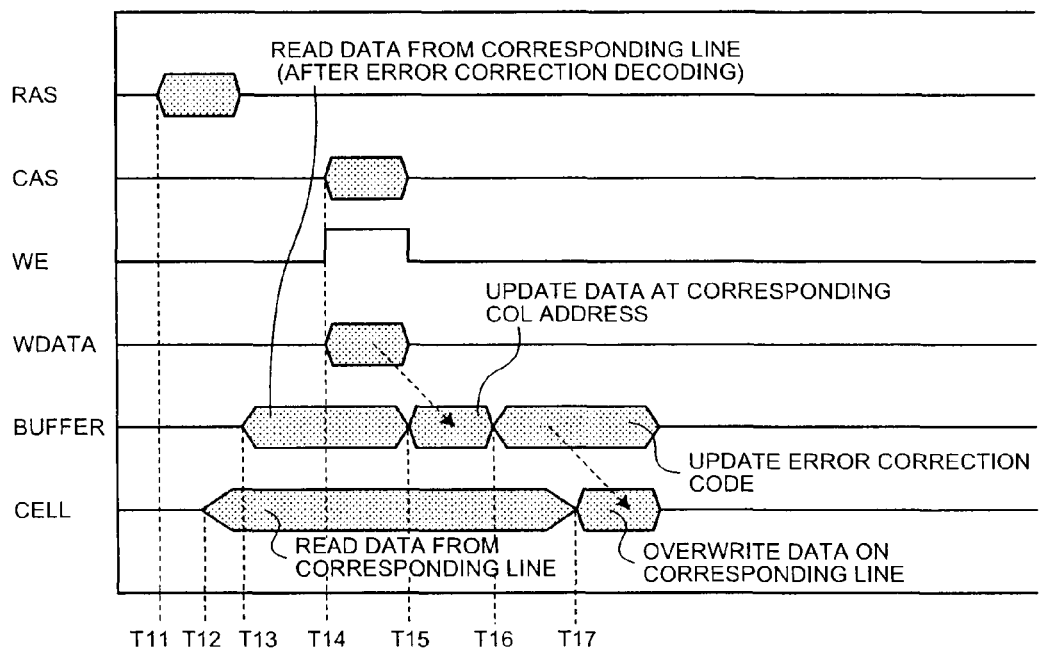
FIG. 6 is a timing chart of the write process according to the first embodiment.
Figure 7:
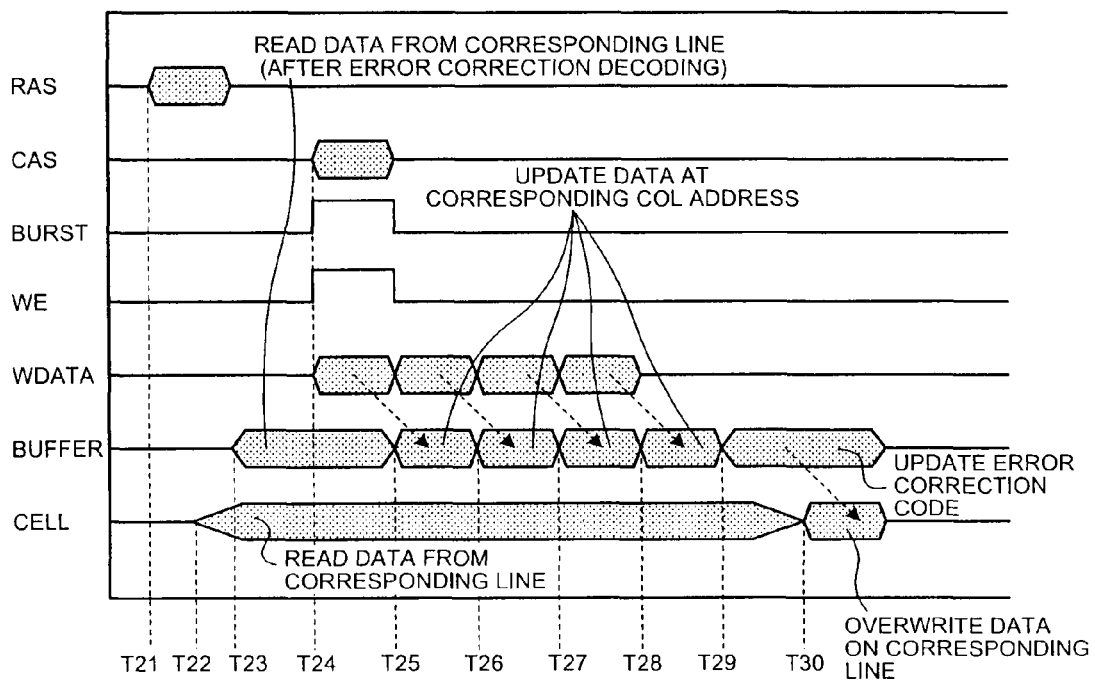
FIG. 7 is another timing chart of the write process according to the first embodiment.

FIGS. 6 and 7 are timing charts for the write process when the ROW address and COL address are input at different timings. FIG. 6 is a timing chart for one item of data to be written (single write), and FIG. 7 is a timing chart for data to be sequentially written into four consecutive COL addresses (burst write).

In FIGS. 6 and 7, "RAS" and "CAS" indicate timings at which the externally supplied ROW address and COL address, respectively, are input. "WE" is a control signal that is externally supplied to give a write instruction, and "WDATA" is target data that is to be written. "Buffer" indicates the state of data in the buffer 132, and "CELL" indicates the state of memory cells on the enabled word line. "BURST" in FIG. 7 indicates a burst signal that gives an instruction of sequentially writing data.

As illustrated in FIG. 6, when a ROW address is input to the ROW address decoding unit 12 (T11), the read/write circuit 112 reads the coded data from memory cells of the memory cell array unit 11 on the line that corresponds to this ROW address (T12). The coded data read from the memory cells is subjected to the error correction decoding process by the error correction coding/decoding circuit 131. The resultant decoded data is stored in the buffer 132 (T13).

Thereafter, when the COL address signal, the control signal that gives a write instruction (WE), and the write target data (WDATA) are input to the COL address decoding unit 14 (T14), the COL address decoding unit 14 updates the decoded data by overwriting the target data into the area of the buffer 132 designated by the COL address (T15). When the writing into the buffer 132 is completed, the error correction coding/decoding circuit 131 executes the error correction coding process onto the decoded data in the buffer 132 (T16). Then, the read/write circuit 112 writes back the coded data of the buffer 132 in the memory cells on the line designated by the ROW address (T17), and the process is terminated.

On the other hand, in the burst write as indicated in FIG. 7, when a ROW address is input to the ROW address decoding unit 12 (T21), the read/write circuit 112 reads the coded data from memory cells of the memory cell array unit 11 on the line (word lines WL) corresponding to this ROW address (T22). The coded data read from the memory cells is subjected to the error correction decoding process by the error correction coding/decoding circuit 131 and then stored in the buffer 132 (T23).

Thereafter, the COL addresses, the burst signal (BURST), the control signal for the write instruction (WE), and the write target data (WDATA) are input to the COL address decoding unit 14 (T24). Then, the COL address decoding unit 14 overwrites the write target data (WDATA1 to WDATA4) into four consecutive areas on the buffer 132 that are designated by the COL addresses, thereby updating the decoded data (T25 through T28). When the writing to the buffer 132 is completed, the error correction coding/decoding circuit 131 executes the error correction coding process on the decoded data of the buffer 132 (T29). Then, the read/write circuit 112 writes back the coded data on the buffer 132 in the memory cells on the line designated by the ROW address (T30), and the process is terminated.

In the examples of FIGS. 6 and 7, the error correction coding process and the memory cell write-back process are performed immediately after the COL address decoding unit 14 writes the write target data into the buffer 132. The timing is not limited thereto, however. For example, the timing may be delayed to the next ROW address input or any time before the decoded data in the buffer is overwritten.

In FIG. 7, four data items are sequentially written in, but the number of data items sequentially written can be determined as any arbitrary number equal to or larger than 2. A signal that designates the number of writes may be externally supplied to determine the number of writes.

Figure 8:
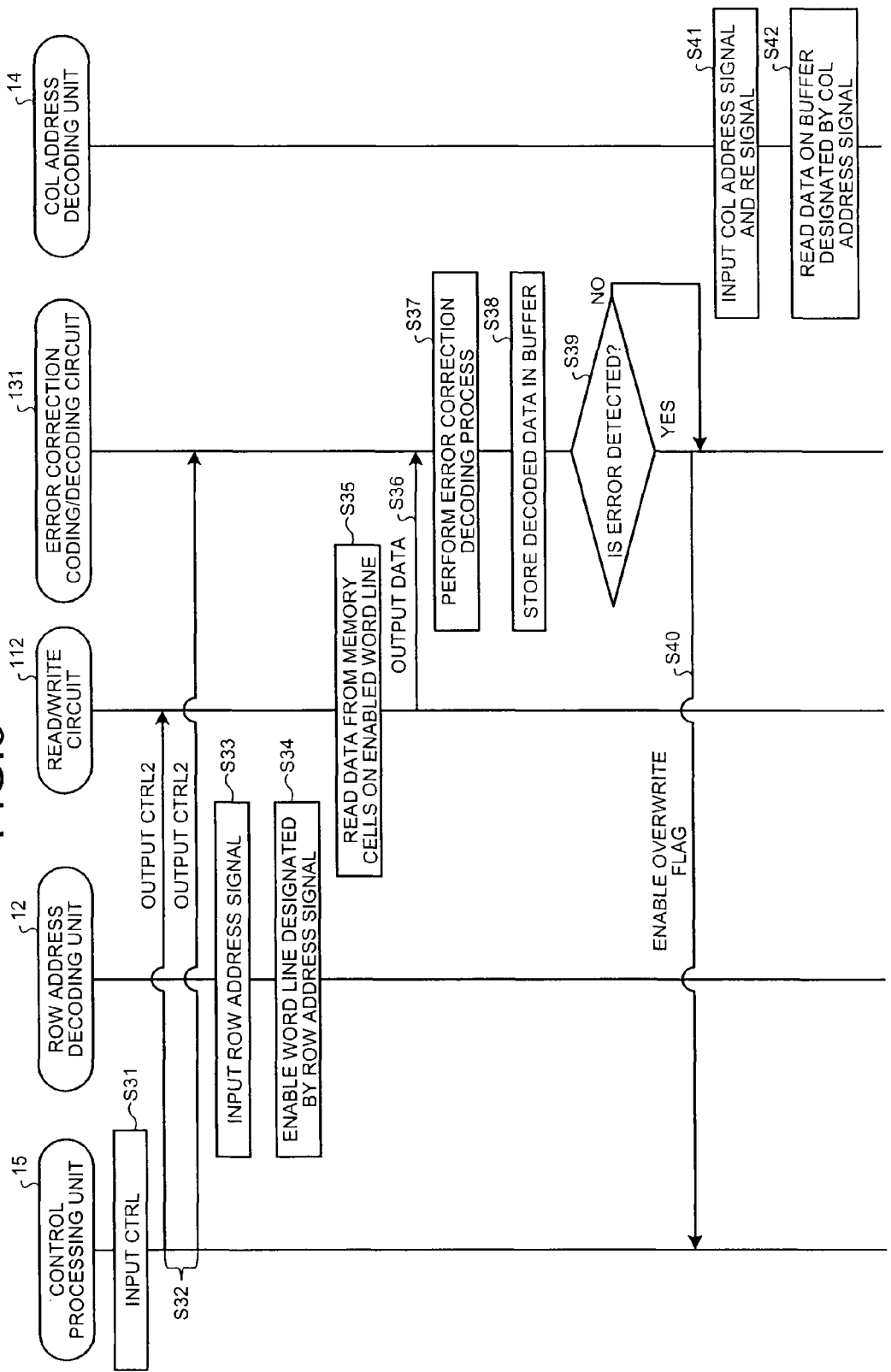
FIG. 8 is a sequence diagram for explaining the procedure of a read process according to the first embodiment.

Next, the operation of reading the coded data from the memory cell array unit 11 and outputting it to the outside is explained below. FIG. 8 is a sequence diagram for showing the procedure of the read process performed by the semiconductor memory device 100. First, when a control signal CTRL that instructs the data read is input from the outside (Step S31), the control processing unit 15 outputs the control signal CTRL2 that instructs the start of the read process to the read/write circuit 112 and the error correction coding/decoding circuit 131 (Step S32) to initiate the write process.

Thereafter, when a ROW address signal is input from the outside (Step S33), the ROW address decoding unit 12 enables a word line WL that corresponds to the ROW address designated by this ROW address signal (Step S34). Then, the read/write circuit 112 reads the coded data from the memory cells on the word lines WL enabled at Step S34 (Step S35), and outputs the data to the error correction coding/decoding circuit 131 by way of the bit line BL0 (Step S36).

The error correction coding/decoding circuit 131 generates decoded data by performing the error correction decoding process onto the coded data input from the read/write circuit 112 (Step S37). Then, the error correction coding/decoding circuit 131 outputs the decoded data to the buffer 132 by way of the bit lines BL1A to store the decoded data in the specific area of the buffer 132 (Step S38). Thereafter, the error correction coding/decoding circuit 131 determines whether the coded data includes any error as a result of the error correction decoding process at Step S37. When no error is detected (No at Step S39), the process at the error correction coding/decoding circuit 131 is terminated.

When an error is detected at Step S39 (Yes at Step S39), the error correction coding/decoding circuit 131 outputs the control signal WB that enables the write-back flag 151 to the control processing unit 15 so that the write-back flag 151 is enabled (Step S40). Then, the process at the error correction coding/decoding circuit 131 is terminated. When an error is detected, the decoded data of the buffer 132 that is subjected to the error correction decoding and the ROW address enabled by the ROW address decoding unit 12 are retained until the later-mentioned write-back process is completed.

Meanwhile, when a COL address signal and a control signal WE that instructs a write process are input from an external device (Step S41), the COL address decoding unit 14 reads decoded data by way of the bit lines BL1 from an area of the buffer 132 that corresponds to a COL address designated by this COL address signal, and outputs the decoded data as read target data to the external device (Step S42). Then, the process is terminated.

The operation of reading the decoded data from the buffer 132 may be performed all at once or divided into multiple times if items of the decoded data have the same ROW address. In a similar manner to the write process, the COL address signal and the control signal for the read instruction may be input after the ROW address signal or at the same timing as the ROW address signal.

According to the present embodiment, the process is initiated in accordance with the input of the control signal CTRL, but the initiation is not limited thereto. For example, the process may be initiated in accordance with the input of the ROW address signal to the ROW address decoding unit 12. If this is the case, the control signal CTRL for the write instruction should be input anytime before Step S38.

The process of writing back the coded data, which is performed when an error is detected as a result of the error correction decoding process in the read process, is now explained. This process is executed when the write-back flag is enabled at Step S40.

Figure 9:
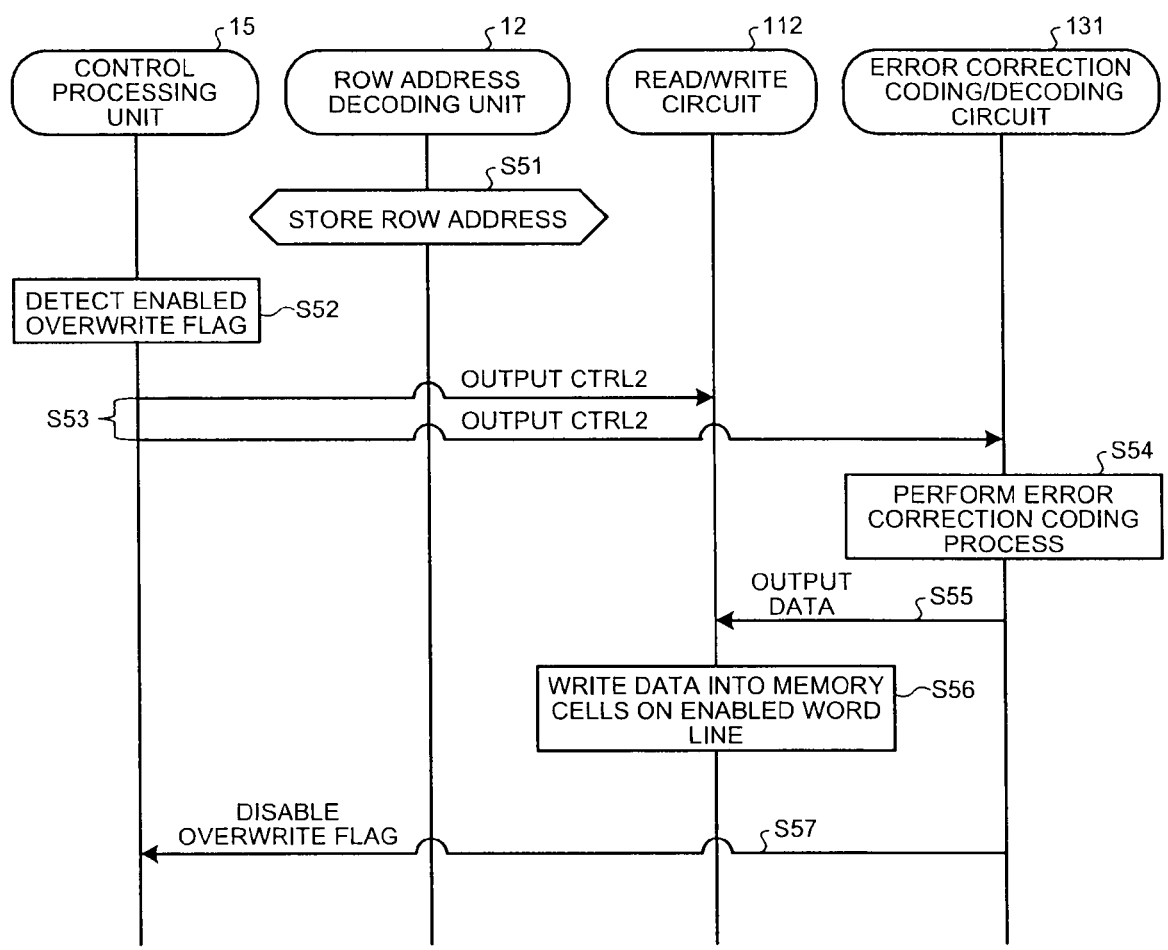
FIG. 9 is a sequence diagram for explaining the procedure of a write-back process according to the first embodiment.

FIG. 9 is a sequence diagram for showing the procedure of the write-back process performed by the semiconductor memory device 100. It is assumed here that the ROW address decoding unit 12 holds the ROW address from the error detection time and has enabled the word line WL that corresponds to this ROW address (Step S51).

First, when the control processing unit 15 detects the write-back flag that is enabled (Step S52), the control processing unit 15 sends the control signal CTRL2 to the memory cell array unit 11 and the error correction coding/decoding circuit 131 to instruct them to start the write-back process. The write-back process is thereby initiated (Step S53).

The error correction coding/decoding circuit 131 performs the error correction coding process on the decoded data retained in the buffer 132 in the read process and thereby generates coded data from the decoded data (Step S54). Next, the error correction coding/decoding circuit 131 outputs the coded data generated at Step S54 to the read/write circuit 112 by way of the bit lines BL0 (Step S55).

Meanwhile, when receiving the coded data from the error correction coding/decoding circuit 131, the read/write circuit 112 writes back the coded data by way of the bit lines BL0A in the memory cells on the word line WL enabled by the ROW address decoding unit 12 so that the coded data in which errors are corrected is written in the memory cell array unit 11 (Step S56). Furthermore, the error correction coding/decoding circuit 131 outputs a control signal that disables the write-back flag 151 to the control processing unit 15 after Step S55 so that the write-back flag 151 is disabled (Step S57). Then, the process is terminated.

The write-back process may be implemented at any timing as long as the reading of the decoded data is unaffected. For example, the write-back process may be performed during the input of the COL address in the read process (Step S41), or immediately before the next ROW address is input.

Figure 10:
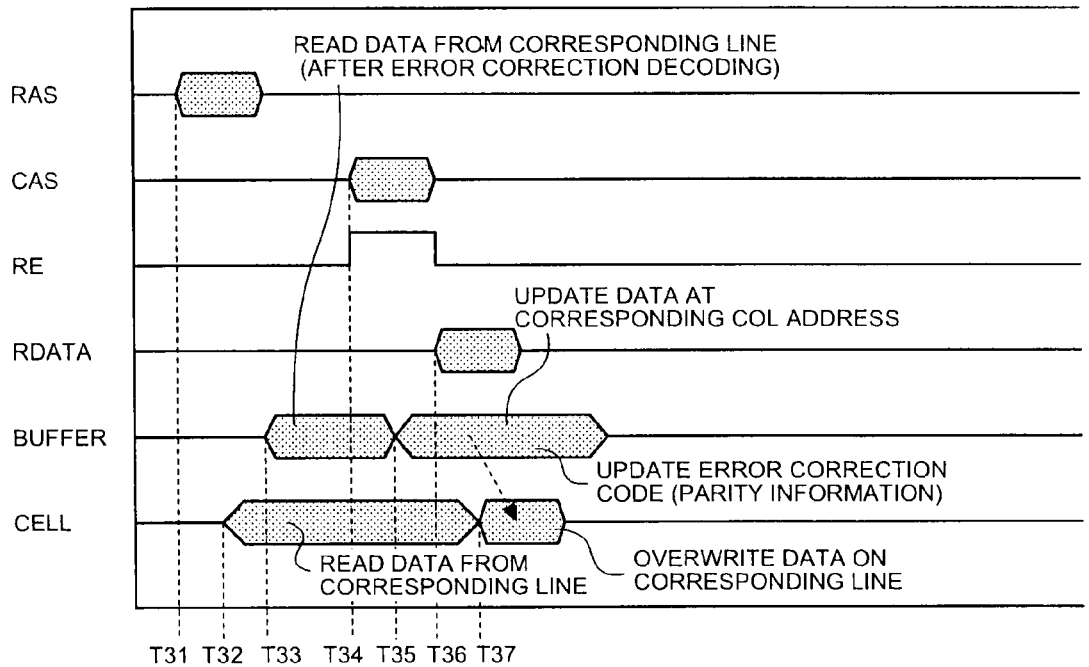
FIG. 10 is a timing chart of the read and write-back processes according to the first embodiment.
Figure 11:
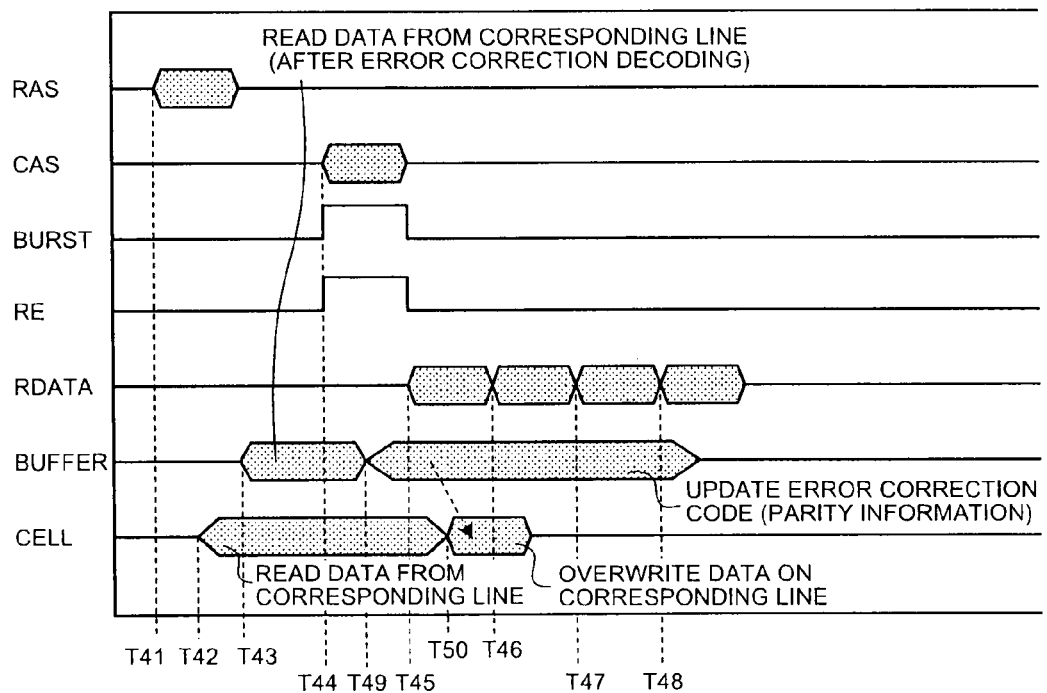
FIG. 11 is another timing chart of the read and write-back processes according to the first embodiment.

FIGS. 10 and 11 are timing charts for the read process and the write-back process when the ROW address and the COL address are input at different timings. In the timing chart of FIG. 10, one item of data is read out (single read). In the timing chart of FIG. 11, four consecutive items of data are read out (burst read).

In the drawings, "RAS" and "CAS" indicate the timings of inputting the ROW address and the COL address, respectively, from an external device. "RE" indicates an externally supplied control signal for instructing the read operation, and "RDATA" indicates data that is to be read out. "Buffer" shows the state of the data in the buffer 132, while "CELL" shows the state of the memory cells on the enabled word line. "BURST" in FIG. 11 indicates a burst signal for instructing the data to be sequentially read out.

As shown in FIG. 10, when the ROW address is input to the ROW address decoding unit 12 (T31), the read/write circuit 112 reads the coded data from the memory cells on the line (row) that corresponds to this ROW address (T32). The error correction coding/decoding circuit 131 performs the error correction decoding process onto the coded data read from the memory cells, and the resultant data is stored as decoded data in the buffer 132 (T33).

Thereafter, when the COL address signal and the control signal instructing the read operation (RE) are input to the COL address decoding unit 14 (T34), the COL address decoding unit 14 reads the decoded data from the area of the buffer 132 designated by the COL address, and outputs the read target data (RDATA) to the external device (T35).

On the other hand, the error correction coding/decoding circuit 131 receives the control signal CTRL2 that instructs the write-back process from the control processing unit 15, and the COL address is input to the COL address decoding unit 14. Then, the decoded data in the buffer 132 is subjected to the error correction coding process to generate coded data (T36). Thereafter, the read/write circuit 112 writes back the coded data generated by the error correction coding/decoding circuit 131 in the memory cells on the word line designated by the ROW address (T37), and the process is terminated. If no error is detected during the error correction decoding process, the operations at T36 and T37 are not performed.

At the burst read as illustrated in FIG. 11, when a ROW address is input to the ROW address decoding unit 12 (T41), the read/write circuit 112 reads the coded data from the memory cells on the word line that corresponds to this ROW address (T42). The coded data read from the memory cells is subjected to the error correction decoding process by the error correction coding/decoding circuit 131, and is stored as decoded data in the buffer 132 (T43).

Thereafter, the COL addresses, the burst signal (BURST), and a control signal that instructs a read operation (RE) are input to the COL address decoding unit 14 (T44). Then, the COL address decoding unit 14 sequentially reads the decoded data from four areas of the buffer 132 designated by the COL addresses (T45 to T48), and outputs the decoded data as the read target data (RDATA) to the external device.

Meanwhile, the error correction coding/decoding circuit 131 receives the control signal CTRL2 that instructs the write-back process from the control processing unit 15. When a COL address is input to the COL address decoding unit 14, the error correction coding/decoding circuit 131 executes the error correction coding process onto the decoded data in the buffer 132 to generate coded data (T49). The read/write circuit 112 writes back the coded data generated by the error correction coding/decoding circuit 131 in the memory cells on the word line designated by the ROW address (T50), and the process is terminated. If no error is detected during the error correction decoding process, the operations at T49 and T50 are skipped.

In the examples of FIGS. 10 and 11, the coded data write-back process is initiated in accordance with the timing of inputting the COL address, but the timing is not limited thereto. For example, the timing may be delayed until the next ROW address is input or anytime before the data in the buffer is overwritten.

In the example of FIG. 11, four consecutive items of data are read out. However, any number of data items larger than two may be sequentially read out. The structure may be configured in such a manner that a signal that specifies the number of data items is input from the outside so that the number of read operations can be determined.

Furthermore, according to the present embodiment, the read control signal RE is input to the COL address decoding unit 14 to instruct the data read operation. However, instead of incorporating this read control signal RE, the read operation may be executed when the write control signal WE is disabled.

According to the first embodiment, the error correction processing unit 13 (error correction coding/decoding circuit 131) is arranged between the read/write circuit 112 and the COL address decoding unit 14 to detect and correct errors in the coded data read by the read/write circuit 112 so that coded data in which errors are corrected can be written back in the memory cells. Thus, any errors in the entire coded data read from the memory cell array unit 11 (memory array 111) can be corrected.

A second embodiment is now explained. The same structural components as those of the first embodiment are given the same reference numerals, and the explanation thereof is omitted.

Figures 12, 13:
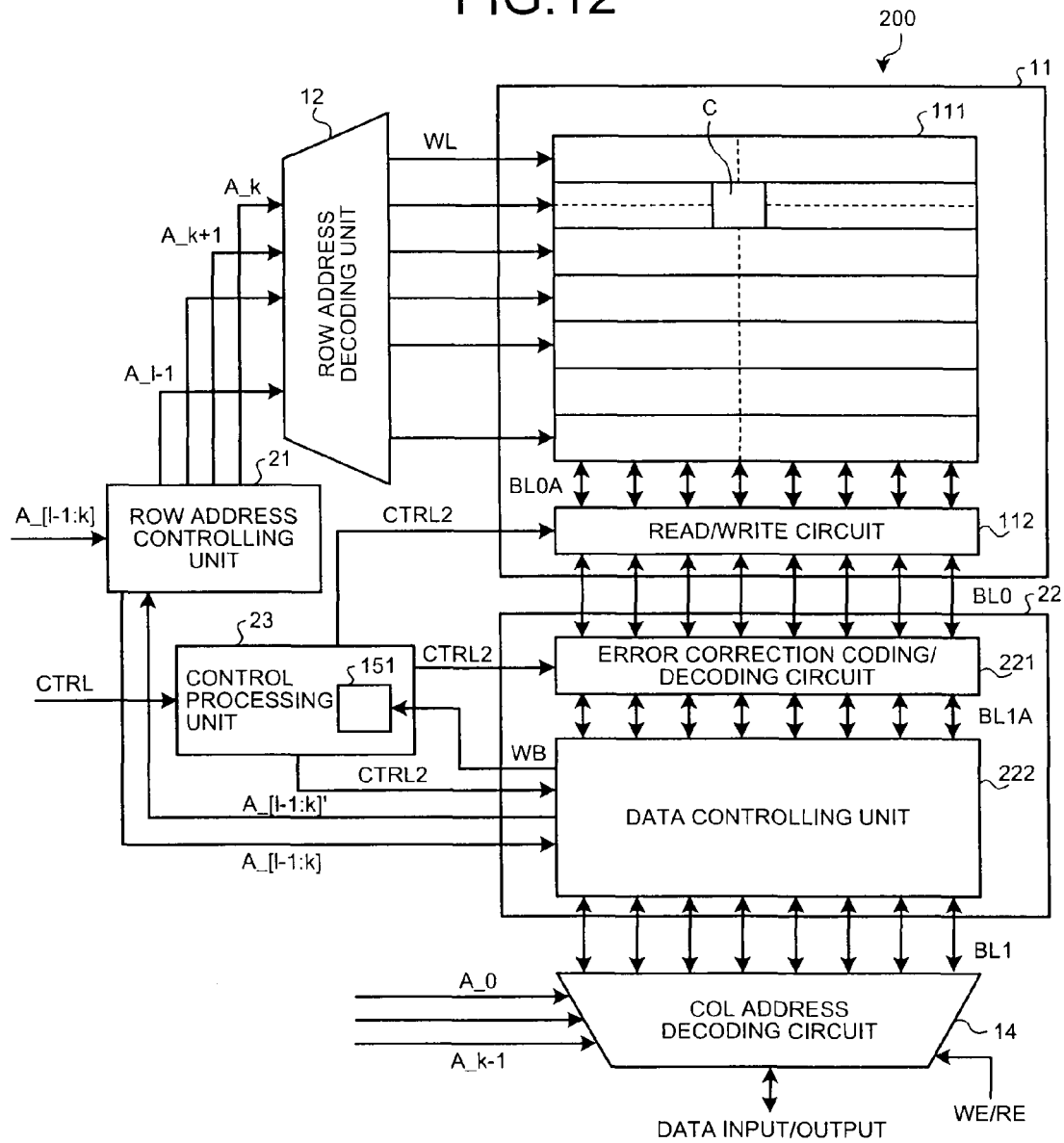
FIG. 12 is a diagram of a structure of a semiconductor memory device according to a second embodiment.
FIG. 13 is a schematic diagram for showing line data stored in a data control circuit.

FIG. 12 is a block diagram of the structure of a semiconductor memory device 200 according to the second embodiment. The semiconductor memory device 200 includes the memory cell array unit 11, the ROW address decoding unit 12, the COL address decoding unit 14, a ROW address controlling unit 21, an error correction processing unit 22, and a control processing unit 23.

The ROW address controlling unit 21 outputs a ROW address signal (A_[1-1:k]) input from an external device to the ROW address decoding unit 12 and the error correction processing unit 22. When the ROW address signal (A_[1-1:k]') is input from the error correction processing unit 22, the ROW address controlling unit 21 outputs this ROW address signal to the ROW address decoding unit 12.

The error correction processing unit 22 is arranged between the memory cell array unit 11 and the COL address decoding unit 14, and provided with an error correction coding/decoding circuit 221 and a data controlling circuit 222.

The error correction coding/decoding circuit 221 has the same function as the error correction coding/decoding circuit 131 that is described above. In addition to this function, the error correction coding/decoding circuit 221 enables an ERR signal to report the occurrence of an error that is detected in the data at the time of the error correction decoding process during data reading, and outputs the signal to the data controlling circuit 222.

The data controlling circuit 222 includes a recording medium (line buffers) that temporarily stores therein the decoded data, and holds and manages the decoded data input from the error correction coding/decoding circuit 221 by way of the bit line BL1A and the data written in by the COL address decoding unit 14 by way of the bit line BL1. Furthermore, the data controlling circuit 222 associates the ROW address signals (A_[1-1] to A_[k]) input from the ROW address controlling unit 21 and the state of the ERR signal input from the error correction coding/decoding circuit 221 with the data input from the error correction coding/decoding circuit 221 and the COL address decoding unit 14, and stores the associated data as line data in a line buffer.

FIG. 13 is a schematic diagram of the structure of the line data stored in the data controlling circuit 222. The data controlling circuit 222 brings into association the ROW addresses corresponding to the ROW address signals input by the ROW address controlling unit 21, the data read by the read/write circuit 112 from the memory cells on the line corresponding to these ROW addresses (in other words, decoded data input by the error correction coding/decoding circuit 221), and write-back determination information (true/false) corresponding to an error notification signal ERR from the error correction coding/decoding circuit 221. The associated data is stored as line data for each ROW address. The decoded data included in each item of line data is stored in association with the COL address of the memory array 111 in which the original coded data for the decoded data is stored.

The line address is identification information for identifying items of the line data in the data controlling circuit 222, and decoded data for one ROW address is included in the line data of each line address of 0 to N (N is an integer). The number of items of line data held by the data controlling circuit 222, or in other words the number of line buffers, can be arbitrarily determined. There may be one item, or multiple items as illustrated in FIG. 13.

When the error correction coding/decoding circuit 221 enables the ERR signal, the data controlling circuit 222 enables the write-back determination information (true). The error correction coding/decoding circuit 221 also outputs the control signal WB that enables the write-back flag 151 to the control processing unit 23 to enables the write-back flag 151.

Moreover, the data controlling circuit 222 outputs the ROW address signal (A_[1-1:k]') that specifies the ROW address of the decoded data in which the write-back determination information is enabled, to the ROW address controlling unit 21 during the write-back process, which will be described later.

The data controlling circuit 222 also determines, in response to the control signal CTRL2 input by the control processing unit 23, whether the decoded data for the target ROW address is stored in one of its own line buffers during the operation of reading from or writing on the memory array 111. When it is determined that the data is stored in a line buffer, the data controlling circuit 222 continues the data write or read operation by use of this decoded data.

When receiving an externally supplied control signal CTRL that instructs a write or read operation, the control processing unit 23 sends the control signal CTRL2 that instructs the write or read process described later to the read/write circuit 112, the error correction coding/decoding circuit 221, and the data controlling circuit 222 so that each of the related units performs an operation in correspondence with the process.

The control processing unit 23 includes the write-back flag 151 that indicates whether a write-back process should be performed onto the internal register or the like. When the enabled write-back flag 151 is detected, the control processing unit 23 outputs to the read/write circuit 112, the error correction coding/decoding circuit 221, and the data controlling circuit 222 the control signal CTRL2 that instructs the start of the write-back process that is described later. As a result, each of the related units performs an operation in correspondence with the write-back process.

The write, read, and write-back processes performed by the semiconductor memory device 200 are now explained in this order.

Figure 14:
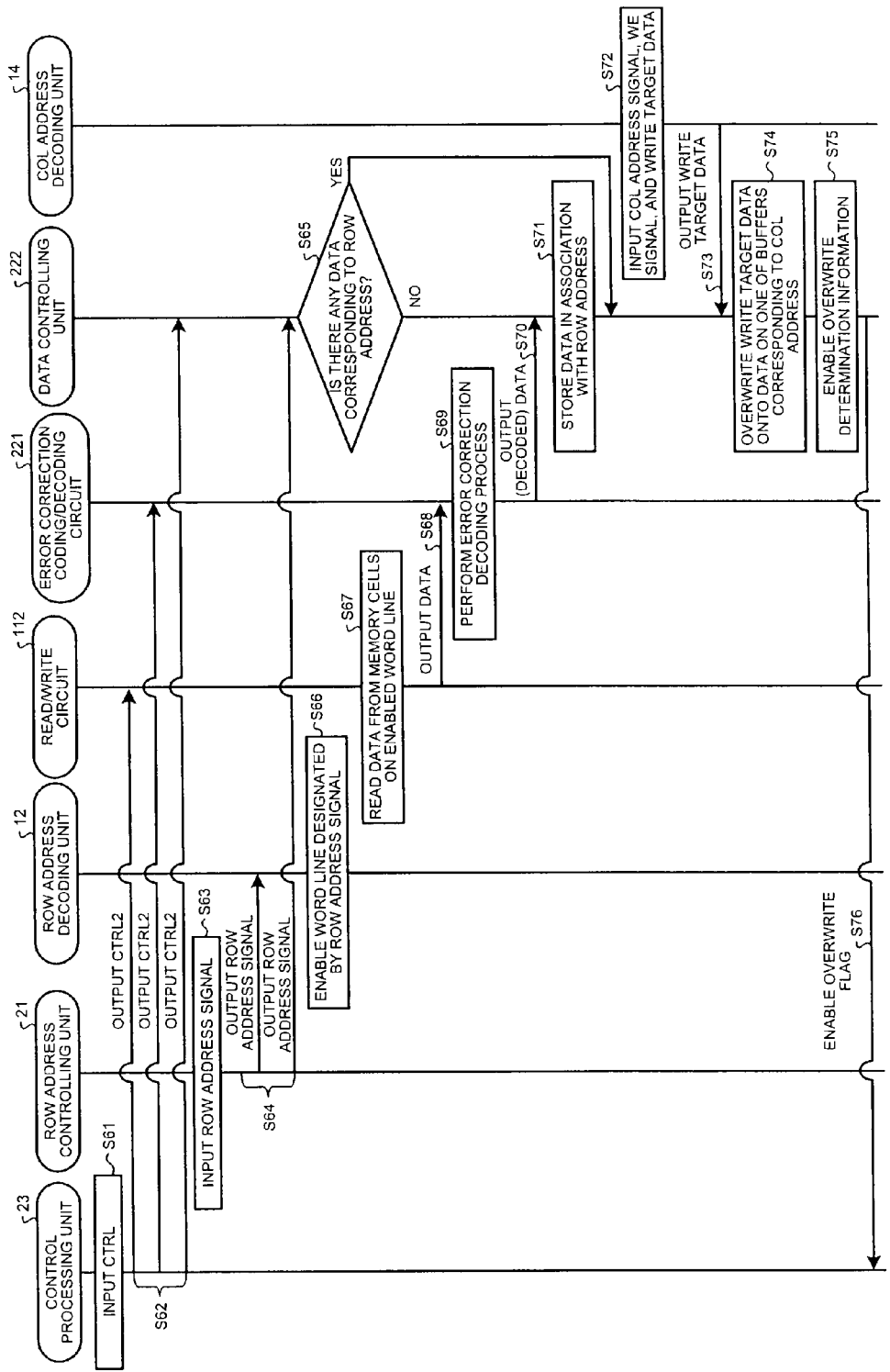
FIG. 14 is a sequence diagram for explaining the procedure of a write process according to the second embodiment.

First, the operation of writing the externally supplied data in the memory cell array unit 11 is explained. FIG. 14 is a sequence diagram for explaining the procedure of the write process performed by the semiconductor memory device 200. When the control signal CTRL is externally supplied to instruct the write operation (Step S61), the control processing unit 15 outputs the control signal CTRL2 to the read/write circuit 112 and the error correction processing unit 22 (the error correction coding/decoding circuit 221 and the data controlling circuit 222) to instruct the start of the write process (Step S62) so that the write process is initiated.

Thereafter, when the ROW address signal is externally supplied (Step S63), the ROW address controlling unit 21 outputs the ROW address signal to the ROW address decoding unit 12 and the data controlling circuit 222 (Step S64).

When the ROW address signal is input from the ROW address controlling unit 21, the data controlling circuit 222 determines whether the decoded data for the ROW address specified by the ROW address signal is stored in one of its own line buffers (Step S65). When it is determined that no decoded data is stored (No at Step S65), the system proceeds to Step S71. When it is determined that the decoded data is stored (Yes at Step S65), the system proceeds to Step S74. The structure may be configured in such a manner to, when the data controlling circuit 222 determines that the decoded data is stored in its own storage area, control the read/write circuit 112 and the error correction coding/decoding circuit 221 not to execute the later described operations at Steps S67 to S71.

On the other hand, when the ROW address signal is input from the ROW address controlling unit 21, the ROW address decoding unit 12 enables the word line WL corresponding to the ROW address designated by the ROW address signal (Step S66). Thereafter, the read/write circuit 112 reads the coded data from the memory cells on the word line WL enabled at Step S66 (Step S67), and outputs the coded data to the error correction coding/decoding circuit 221 by way of the bit lines BL0 (Step S68).

The error correction coding/decoding circuit 221 generates decoded data by performing the error correction decoding process on the coded data input from the read/write circuit 112 (Step S69), and outputs the decoded data to the data controlling circuit 222 by the bit lines BL1A (Step S70). When the decoded data is input from the error correction coding/decoding circuit 221, the data controlling circuit 222 associates this decoded data with the ROW address designated by the ROW address signal that is input from the ROW address controlling unit 21, and stores therein the associated data as line data (Step S71). The line data stored at Step S71 includes the write-back determination information in a disabled state.

On the other hand, when receiving the COL address signal, the control signal WE that instructs the write operation, and the write target data from the outside (Step S72), the COL address decoding unit 14 outputs the write target data to the data controlling circuit 222 by way of the bit line BL1 corresponding to the COL address that is designated by this COL address signal (Step S73). When the write target data is received from the COL address decoding unit 14, the data controlling circuit 222 overwrites the write target data included in the decoded data stored in the line buffer at Step S71, onto the decoded data corresponding to the COL address. The decoded data is thereby updated (Step S74).

Next, the data controlling circuit 222 enables the write-back determination information in the line buffer updated at Step S74 (Step S75), and outputs the control signal WB that enables the write-back flag 151 to the control processing unit 23 (Step S76). Then, the process is terminated.

In the process according to the present embodiment, when the decoded data of the line (ROW address) of the memory array 111 to which the write operation is performed is already stored in the memory area of the data controlling circuit 222, the data is updated by use of this decoded data. Thus, the efficiency of the process is improved. The write-back process executed in accordance with the operation at Step S76 will be discussed later.

According to the present embodiment, the process is initiated in accordance with the input of the control signal CTRL, but the initiating manner is not limited thereto. For example, the process may be initiated in accordance with the ROW address signal supplied to the ROW address controlling unit 21. If this is the case, the control signal CTRL that instructs the write operation should be input anytime before Step S71. When the control signal CTRL includes a predetermined control command, the control signal CTRL2 may be generated by interpreting (decoding) this command.

Figure 15:
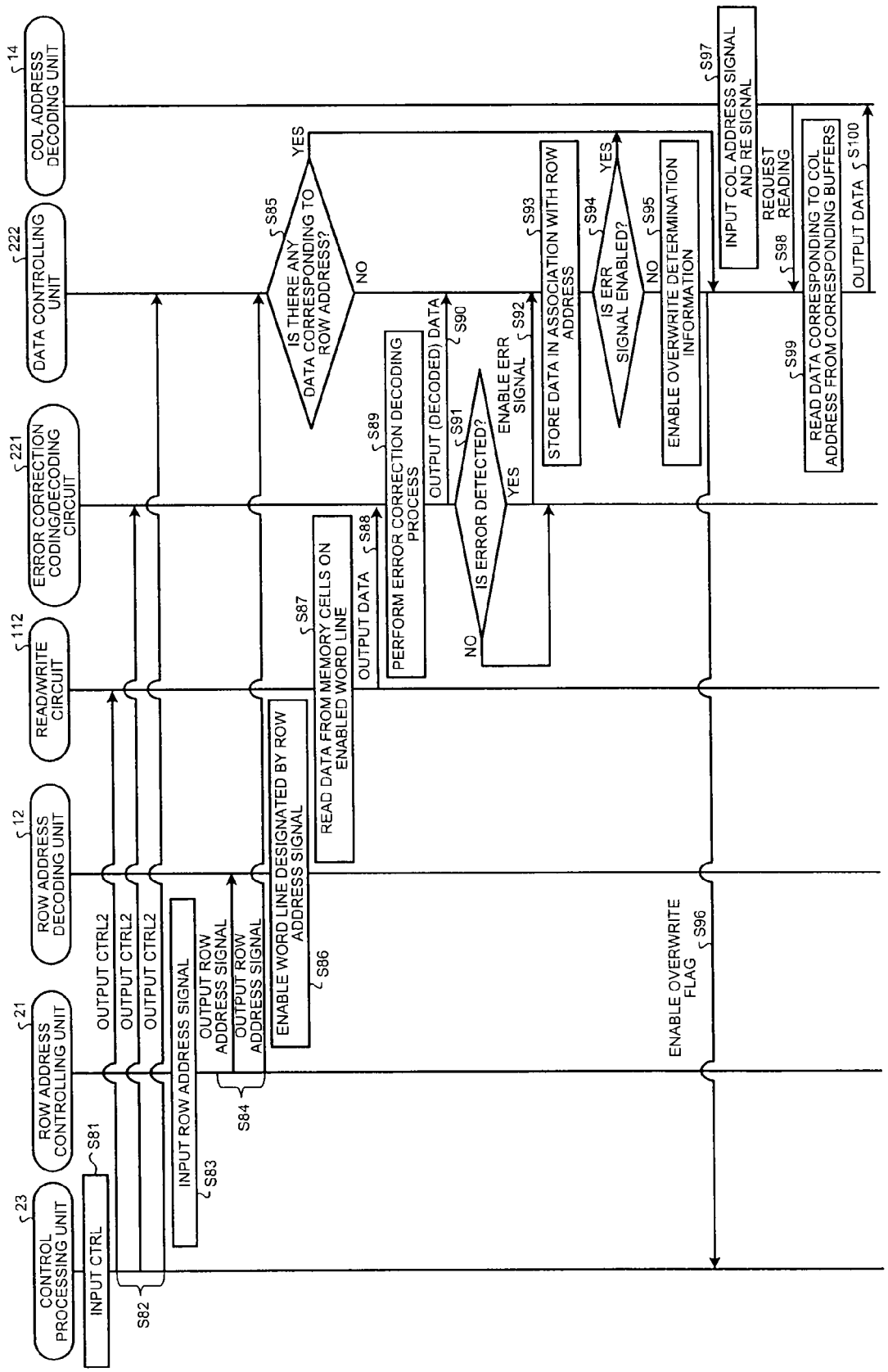
FIG. 15 is a sequence diagram for explaining the procedure of a read process according to the second embodiment.

Next, the operation of reading data from the memory cell array unit 11 and outputting it to an external device is explained. FIG. 15 is a sequence diagram for showing the read process performed by the semiconductor memory device 200. When the control signal CTRL that instructs the data read operation is externally supplied (Step S81), the control processing unit 15 outputs the control signal CTRL2 to the read/write circuit 112 and the error correction processing unit 22 (the error correction coding/decoding circuit 221 and the data controlling circuit 222) to instruct the start of the read process (Step S82) so that the write process is initiated.

Thereafter, when the ROW address signal is externally supplied (Step S83), the ROW address controlling unit 21 outputs this ROW address signal to the ROW address decoding unit 12 and the data controlling circuit 222 (Step S84).

When the ROW address signal is input from the ROW address controlling unit 21, the data controlling circuit 222 determines whether the decoded data related to the ROW address designated by this ROW address signal is stored in one of its own line buffers (Step S85). When it is determined that the decoded data is not stored (No at Step S85), the system proceeds to Step S93. When it is determined that the decoded data is stored (Yes at Step S85), the system proceeds to Step S99. The structure may be configured in such a manner as to, when the data controlling circuit 222 determines that the decoded data is stored in its own storage area, control the ROW address decoding unit 12, the read/write circuit 112, and the error correction coding/decoding circuit 221 not to execute the later described operations at Steps S86 to S95.

On the other hand, when the ROW address signal is input from the ROW address controlling unit 21, the ROW address decoding unit 12 enables the word line WL that corresponds to the ROW address designated by this ROW address signal (Step S86). Thereafter, the read/write circuit 112 reads coded data from the memory cells on the word line WL enabled at step S86 (Step S87), and outputs the coded data to the error correction coding/decoding circuit 221 by way of the bit line BL0 (Step S88).

The error correction coding/decoding circuit 221 executes the error correction decoding process on the coded data input from the read/write circuit 112 and generates decoded data (Step S89). Then, the error correction coding/decoding circuit 221 outputs the decoded data to the data controlling circuit 222 by way of the bit lines BL1A (Step S90). Next, the error correction coding/decoding circuit 221 determines whether an error is detected in the error correction decoding process at Step S89 (Step S91). When it is determined that an error is not detected (No at Step S91), the process at the error correction coding/decoding circuit 221 is terminated. When it is determined that an error is detected (Yes at Step S91), the error correction coding/decoding circuit 221 enables the ERR signal and outputs it to the data controlling circuit 222 (Step S92). Then, the process at the error correction coding/decoding circuit 221 is terminated.

On the other hand, when the coded data is received from the error correction coding/decoding circuit 221, the data controlling circuit 222 associates this coded data with the ROW address designated by the ROW address signal that is input from the ROW address controlling unit 21, and stores therein the associated data as line data (Step S93). The line data stored at Step S93 includes the write-back determination information in a disabled state.

Thereafter, the data controlling circuit 222 determines whether the ERR signal is enabled or disabled. When it is determined that the ERR signal is disabled (No at Step S94), the system proceeds to Step S99. When it is determined at Step S94 that the ERR signal is enabled (Yes at Step S94), the data controlling circuit 222 enables the write-back determination information of the data stored at Step S93 (Step S95), and outputs the control signal WB that enables the write-back flag 151 to the control processing unit 23 (Step S96).

On the other hand, when the COL address signal and the control signal RE that instructs the read operation are externally supplied (Step S97), the COL address decoding unit 14 sends a request of data read to the data controlling circuit 222 by way of the bit line BL1 corresponding to the COL address designated by this COL address signal (Step S98).

When receiving the request of data read from the COL address decoding unit 14, the data controlling circuit 222 reads the decoded data corresponding to the COL address that is included in the decoded data stored in relation to the ROW address received at Step S85 (Step S99), and outputs the read out data to the COL address decoding unit 14 (Step S100). Then, the process is terminated. It should be noted that the COL address decoding unit 14 outputs to an external device the data that is input from the data controlling circuit 222, as the read target data.

In the process according to the present embodiment, when the decoded data for the line (ROW address) of the memory array 111 from which the data is read is already stored in the storage area of the data controlling circuit 222, this decoded data can be used as the read target data. The efficiency of the process is thereby enhanced.

The process according to the present embodiment is initiated in accordance with the input of the control signal CTRL, but the initiating manner is not limited thereto. For example, the process may be initiated when the ROW address signal is input to the ROW address controlling unit 21. In such a structure, the control signal CTRL for instructing the read operation should be input anytime before Step S90.

The process of writing back the coded data to the memory cell array unit 11 is now explained. This process is executed in accordance with the operation of enabling the write-back flag 151 at Steps S76 and S96.

Figure 16:
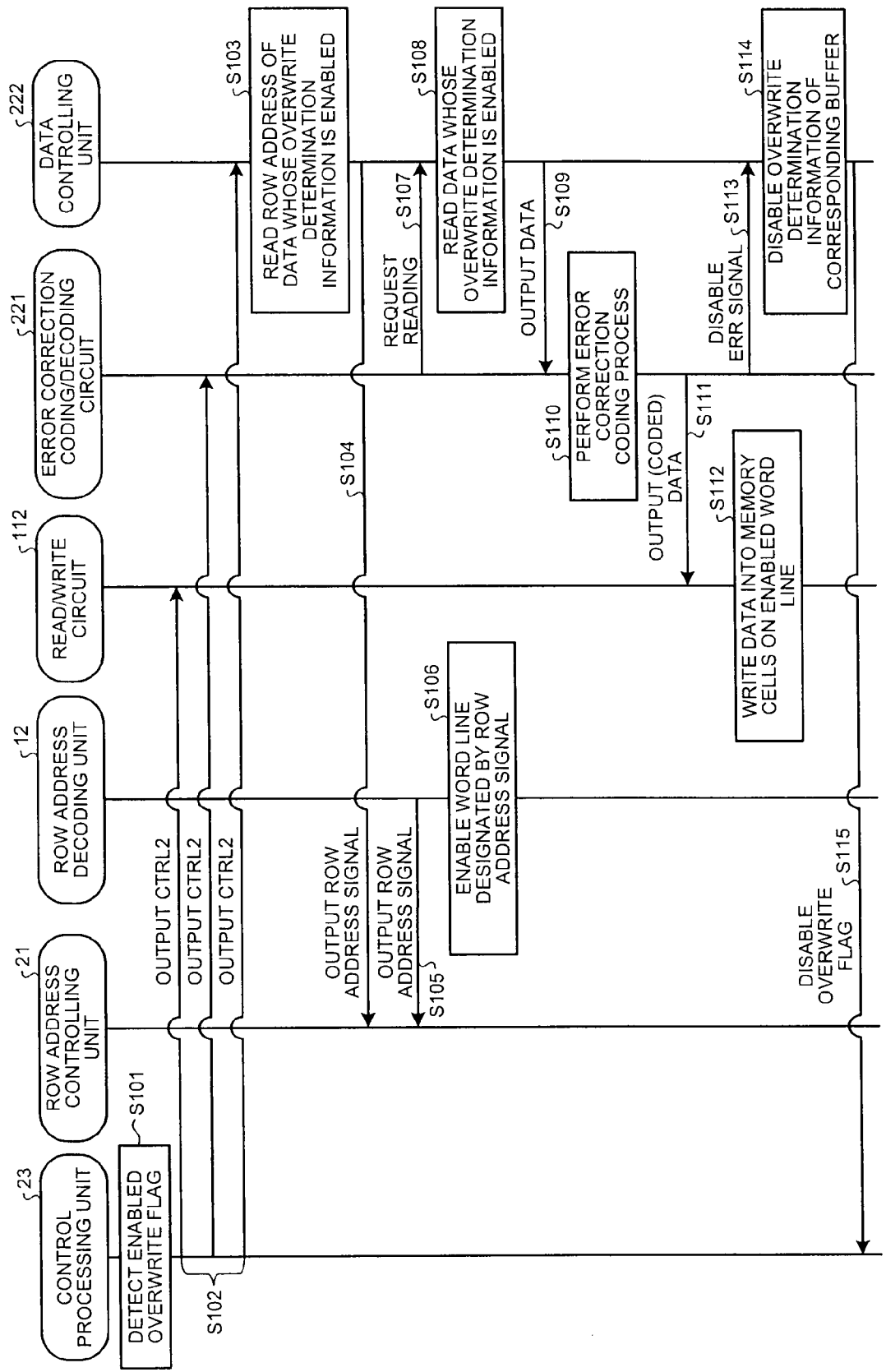
FIG. 16 is a sequence diagram for explaining the procedure of a write-back process according to the second embodiment.

FIG. 16 is a sequence diagram for showing the procedure of the write-back process by the semiconductor memory device 200. First, when detecting the enabled state of the write-back flag (Step S101), the control processing unit 15 outputs the control signal CTRL2 that instructs the write-back process to the read/write circuit 112 and the error correction processing unit 22 (the error correction coding/decoding circuit 221 and the data controlling circuit 222) so that the write-back process is initiated (Step S102).

Thereafter, the data controlling circuit 222 reads the ROW address associated with the decoded data in which its write-back determination information is enabled (true), from among the decoded data stored in the line buffers in the data controlling circuit 222 (Step S103). Then, the data controlling circuit 222 outputs the ROW address signal that designates this ROW address to the ROW address controlling unit 21 (Step S104). When the ROW address signal is received from the data controlling circuit 222, the ROW address controlling unit 21 outputs this ROW address signal to the ROW address decoding unit 12 (Step S105). In accordance with this output, the ROW address decoding unit 12 enables the word line WL that corresponds to the ROW address designated by the ROW address signal (Step S106).

On the other hand, when the error correction coding/decoding circuit 221 requests that the data controlling circuit 222 reads the decoded data out (Step S107), the data controlling circuit 222 reads the decoded data that has its write-back flag enabled (true) from among the line data stored in the line buffers (Step S108) and outputs the decoded data to the error correction coding/decoding circuit 221 (Step S109).

Thereafter, the error correction coding/decoding circuit 221 performs the error correction coding process onto the decoded data read from the data controlling circuit 222 to generate the coded data (Step S110), and outputs the coded data to the read/write circuit 112 (Step S111).

When receiving the coded data from the error correction coding/decoding circuit 221, the read/write circuit 112 writes this coded data in the memory cells on the word line WL enabled by the ROW address decoding unit 12 (Step S112).

After Step S111, the error correction coding/decoding circuit 221 disables the ERR signal for the decoded data read from the data controlling circuit 222, and outputs it to the data controlling circuit 222 (Step S113). When the data controlling circuit 222 is notified by the error correction coding/decoding circuit 221 that the ERR signal is disabled, the data controlling circuit 222 disables the write-back flag (false) that is associated with the decoded data read out at Step S108 (Step S114). Then, the data controlling circuit 222 outputs the control signal WB that disables the write-back flag 151 to the control processing unit 23 (Step S115), and terminates the process.

According to the second embodiment, the error correction processing unit 22 (error correction coding/decoding circuit 221) is arranged between the read/write circuit 112 and the COL address decoding unit 14 to detect and correct errors in the coded data read out by the read/write circuit 112. Due to this arrangement, the coded data in which any errors are corrected is written back in the memory cells. Thus, any errors in the entire coded data read from the memory cell array unit 11 (memory array 111) can be corrected.

When the decoded data that corresponds to the coded data stored in the memory cells on the word line WL (ROW address) of the memory array 111 to which the data is written or the word line WL of the memory array 111 from which the data is read is already stored in the line buffers of the data controlling circuit 222, the data can be updated and read by use of this decoded data. Thus, the efficiency of the process is increased.

When the data controlling circuit 222 includes several items of line data, the order of data write-back operations is not particularly limited, unless the decoded data that has its write-back determination information enabled is lost.

The maximum number of items of line data that can be stored in the line buffers, or in other words the number of line buffers are usually smaller than the total number of word lines WL of the memory array 111. Thus, the line buffers in which data is already written need to be freed up for the storage of new line data. Any line buffer that does not include the decoded data having the enabled write-back determination information should be freed up first. The order of freeing the line buffers up is not specifically determined. For example, a line buffer for which the longest period of time has passed since the last access may be freed up first, or any line buffer may be freed up in a random fashion.

A line buffer can be freed up at any timing unless the decoded data with its write-back determination information enabled would be lost. For example, the timing may be, as in a cache memory, when new decoded data is to be input but there is no line buffer available. Alternatively, the timing may be when a predetermined period of time elapses after data is stored in the line buffer, or when a predetermined period of time elapses after the last access is made to the line data on the line buffer.

Furthermore, as indicated in FIG. 17, each item of decoded data may be stored in association with availability determination information showing whether the line data can be deleted or in other words whether the line buffer can be freed up.

FIG. 17 is a schematic diagram for showing another example structure, as a modification of the present embodiment, of the line data stored in the data controlling circuit 222. The data controlling circuit 222 stores therein the availability determination information (true/false) indicating whether the line data can be deleted, in addition to the ROW addresses, the decoded data corresponding to the coded data at the ROW addresses, and the write-back determination information in association with one another.

When the line data having the data structure of FIG. 17 is adopted, the data controlling circuit 222 refers to the availability determination information in the line data and frees up line buffers with the availability determination information showing a disable state (false). The availability determination information may be switched between enable and disable states by the data controlling circuit 222 in an independent manner, or in accordance with a control signal input by the control processing unit 23 or any other functional unit. The availability determination information may be switched from the enable state to the disable state when a predetermined period of time elapses after the data is put into the line buffer, or when a predetermined period of time elapses after the last access is made to the line data on the line buffer, as explained above.

The two embodiments have been discussed, but the present invention is not limited thereto. Any changes, modifications, and additions may be made without departing from the scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array in which a plurality of memory cells that stores therein coded data to which an error correction code is added and that are arranged at intersections of a plurality of first data lines and a plurality of second data lines;
   an enabling unit that enables one of the first data lines in the memory cell array that is designated from an external device;
   a reading unit that reads a plurality of coded data from memory cells on an enabled first data line;

a decoding unit that corrects an error in the coded data read by the reading unit using the error correction code and generates decoded data by decoding the coded data;
a storage unit that stores therein the decoded data generated by the decoding unit in association with a second data line corresponding to a position of a memory cell from which the decoded data is read;
an output unit that outputs, from among the decoded data stored in the storage unit, decoded data associated with a second data line designated from the external device, to the external device;
an overwriting unit that overwrites decoded data associated with the enabled first data line and the second data line that are designated from the external device with target data to be written;
a coding unit that codes entire decoded data including the decoded data overwritten by the overwriting unit, and generates coded data by adding the error correction code to coded decoded data; and
a write-back unit that writes back the coded data generated by the coding unit to the memory cells on the enabled first data line in the memory cell array that is enabled by the enabling unit.

2. The device according to claim 1, wherein
the storage unit stores therein at least one line data in which the decoded data generated by the decoding unit is associated with the first data line corresponding to the position of the memory cell from which the decoded data is read, detection result information indicating whether the decoding unit detects an error in the decoded data,
the enabling unit enables the first data line associated with the detection result information indicating that an error is detected, and
the write-back unit writes back the decoded data associated with the detection result information indicating that the error is detected in the memory cell on the enabled first data line.

3. The device according to claim 2, further comprising:
a storage controlling unit that determines whether the decoded data stored in the storage unit includes decoded data associated with the first data line designated from the external device, and upon determining that the decoded data associated with the first data line designated from the external device is included, controls storage of the storage unit regarding new line data for the first data line designated from the external device.

4. The device according to claim 3, wherein
the storage controlling unit frees up a storage area of the line data that includes the detection result information indicating that no error is detected from among the line data stored in the storage unit so that the new line data can be stored.

5. The device according to claim 4, wherein
the storage unit further stores therein availability determination information indicating whether the storage area is ready to be freed up in association with the line data stored in the storage area, and
the storage controlling unit frees up the storage area whose availability determination information indicates that the storage area can be freed up.

6. The device according to claim 5, wherein
the storage controlling unit switches the availability determination information associated with the line data from a non-readiness state to a readiness state in a predetermined time after the line data is stored in the storage unit.

7. The device according to claim 1, wherein
the first data lines are word lines of the memory cell array, and
the second data lines are bit lines of the memory cell array.

8. An error correcting method for a semiconductor memory device including a memory cell array in which a plurality of memory cells that stores therein coded data to which an error correction code is added and that are arranged at intersections of a plurality of first data lines and a plurality of second data lines, the error correcting method comprising:
enabling one of the first data lines that is designated from an external device;
reading a plurality of coded data from memory cells on an enabled first data line in the memory cell array;
decoding by
correcting an error in the coded data read at the reading using the error correction code, and
generating decoded data by decoding the coded data;
storing the decoded data generated at the decoding in association with a second data line corresponding to a position of a memory cell from which the decoded data is read;
outputting, from among the decoded data, decoded data associated with a second data line designated from the outside to the external device;
overwriting decoded data associated with the enabled first data line and the second data line that are designated from the external device with target data to be written;
coding by
coding entire decoded data including the decoded data overwritten at the overwriting, and
generating coded data by adding the error correction code to coded decoded data; and
writing back the coded data generated at the coding to the memory cells on the enabled first data line in the memory cell array that is enabled by the enabling.

9. A non-transitory computer-readable recording medium that stores therein a computer program for correcting an error in a semiconductor memory device including a memory cell array in which a plurality of memory cells that stores therein coded data to which an error correction code is added and that are arranged at intersections of a plurality of first data lines and a plurality of second data lines, the computer program when executed causing a computer to execute:
enabling one of the first data lines that is designated from an external device;
reading a plurality of coded data from memory cells on an enabled first data line in the memory cell array;
decoding by
correcting an error in the coded data read at the reading using the error correction code and
generating decoded data by decoding the coded data;
storing the decoded data generated at the decoding in association with a second data line corresponding to a position of a memory cell from which the decoded data is read;
outputting, from among the stored decoded data, decoded data associated with a second data line designated from the external device, to the external device;
overwriting decoded data associated with the enabled first data line and the second data line that are designated from the external device with target data to be written;
coding by
coding entire decoded data including the decoded data overwritten at the overwriting, and
generating coded data by adding the error correction code to coded decoded data; and writing back the coded data generated at the coding to the memory cells on the enabled first data line in the memory cell array that is enabled by the enabling.

10. A semiconductor memory device comprising:
a memory cell array in which a plurality of memory cells that stores therein coded data to which an error correction code is added and that are arranged at intersections of a plurality of first data lines and a plurality of second data lines;
an enabling unit that enables one of the first data lines in the memory cell array that is designated from an external device;
a reading unit that reads a plurality of coded data from memory cells on an enabled first data line;
a decoding unit that corrects an error in the coded data read by the reading unit using the error correction code and generates decoded data by decoding the coded data;
a storage unit that stores therein line data in which the decoded data generated by the decoding unit is associated with a first data line and a second data line corresponding to a position of a memory cell from which the decoded data is read, detection result information indicating whether the decoding unit detects an error in the decoded data,
an output unit that outputs, from among the decoded data stored in the storage unit, decoded data associated with a second data line designated from the external device, to the external device;
an overwriting unit that overwrites decoded data associated with the enabled first data line and the second data line that are designated from the external device with target data to be written;
a coding unit that codes entire decoded data including the decoded data overwritten by the overwriting unit and generates coded data by adding the error correction code to coded decoded data;
a write-back unit that writes back the coded data generated by the coding unit to the memory cells on the enabled first data line in the memory cell array that is enabled by the enabling unit; and
a storage controlling unit that determines whether the decoded data stored in the storage unit includes decoded data associated with the first data line designated from the external device and that upon determining that the decoded data associated with the first data line designated from the external device is included, controls storage of the storage unit regarding new line data for the first data line designated from the external device;
wherein
the enabling unit enables the first data line associated with the detection result information indicating that an error is detected, and
the write-back unit writes back the decoded data associated with the detection result information indicating that the error is detected in the memory cell on the enabled first data line.

11. An error correcting method for a semiconductor memory device including a memory cell array in which a plurality of memory cells that stores therein coded data to which an error correction code is added and that are arranged at intersections of a plurality of first data lines and a plurality of second data lines, the error correcting method comprising:
enabling one of the first data lines that is designated from an external device;
reading a plurality of coded data from memory cells on an enabled first data line in the memory cell array;
decoding by
correcting an error in the coded data read at the reading using the error correction code, and
generating decoded data by decoding the coded data;
storing the decoded data generated at the decoding in association with a second data line corresponding to a position of a memory cell from which the decoded data is read;
outputting, from among the stored decoded data, decoded data associated with a second data line designated from the external device, to the external device;
overwriting decoded data associated with the enabled first data line and the second data line that are designated from the external device with target data to be written;
coding by
coding entire decoded data including the decoded data overwritten at the overwriting, and
generating coded data by adding the error correction code to coded decoded data; and
writing back the coded data generated at the coding to the memory cells on the enabled first data line in the memory cell array that is enabled by the enabling.

12. A non-transitory computer-readable recording medium that stores therein a computer program for correcting an error in a semiconductor memory device including a memory cell array in which a plurality of memory cells that stores therein coded data to which an error correction code is added are arranged at intersections of a plurality of first data lines and a plurality of second data lines, the computer program when executed causing a computer to execute:
enabling one of the first data lines that is designated from an external device;
reading a plurality of coded data from memory cells on an enabled first data line in the memory cell array;
decoding by
correcting an error in the coded data read at the reading using the error correction code, and
generating decoded data by decoding the coded data;
storing the decoded data generated at the decoding in association with a second data line corresponding to a position of a memory cell from which the decoded data is read;
outputting, from among the stored decoded data, decoded data associated with a second data line designated from the external device, to the external device;
overwriting decoded data associated with the enabled first data line and the second data line that are designated from the external device with target data to be written;
coding by
coding entire decoded data including the decoded data overwritten at the overwriting, and
generating coded data by adding the error correction code to coded decoded data; and
writing back the coded data generated at the coding to the memory cells on the enabled first data line in the memory cell array that is enabled by the enabling.

* * * * *